United States Patent

Maemoto et al.

[11] Patent Number: 6,017,677
[45] Date of Patent: Jan. 25, 2000

[54] PLANOGRAPHIC PRINTING PLATE

[75] Inventors: Kazuo Maemoto; Koichi Kawamura; Katsuji Kitatani; Fumikazu Kobayashi, all of Shizuoka-ken, Japan

[73] Assignee: Fuji Photo Film Co., Ltd., Minami-Ashigara, Japan

[21] Appl. No.: 09/012,596

[22] Filed: Jan. 23, 1998

[30] Foreign Application Priority Data

Jan. 24, 1997 [JP] Japan .................................. 9-010755
Feb. 10, 1997 [JP] Japan .................................. 9-026877
Feb. 10, 1997 [JP] Japan .................................. 9-026878
Feb. 20, 1997 [JP] Japan .................................. 9-036665

[51] Int. Cl.[7] .................................................. G03C 1/492
[52] U.S. Cl. ........................ 430/270.1; 430/302; 101/467
[58] Field of Search .............................. 430/270.1, 302; 101/456, 467

[56] References Cited

U.S. PATENT DOCUMENTS

| | | | |
|---|---|---|---|
| 4,869,995 | 9/1989 | Shirai et al. .............................. | 430/270 |
| 5,204,217 | 4/1993 | Aoai et al. ............................... | 430/270 |
| 5,731,123 | 3/1998 | Kawamura et al. ..................... | 430/176 |

FOREIGN PATENT DOCUMENTS

| | | |
|---|---|---|
| 652483 | 5/1995 | European Pat. Off. . |
| 0795789 | 9/1997 | European Pat. Off. . |
| 63-257750 | 10/1988 | Japan . |

OTHER PUBLICATIONS

Patent Abstracts of Japan, vol. 009, No. 294 (M–431), Nov. 20, 1985 and JP 60 132760 A (ASAHI KASEI KOGYO KK), Jul. 15, 1985 *abstract*.

*Primary Examiner*—Janet Baxter
*Assistant Examiner*—Rosemary Ashton
*Attorney, Agent, or Firm*—Burns, Doane, Swecker & Mathis, LLP

[57] ABSTRACT

The present invention provide a planographic printing plate comprising a substrate having thereon a recording layer which comprises at least one of a polymer compound carrying on a side chain a functional group which generates sulfonic acid under influence of an acid, base or heating; and a photo acid-generating agent or acid-generating agent; thermal base-generating agent; or an infrared ray absorbing agent, and by this structure, a high sensitive positive type planographic printing plate which can be developed with water or requires no developing is provided.

9 Claims, No Drawings

PLANOGRAPHIC PRINTING PLATE

This application claims priority under 35 U.S.C. §§ 119 and/or 365 to Japanese Application No. 9-10755 filed on Jan. 24, 1997; Japanese Application No. 9-26877 filed on Feb. 10, 1997; Japanese Application No. 9-26878 filed on Feb. 10, 1997 and Japanese Application No. 9-36665 filed on Feb. 20, 1997; the entire contents of which is hereby incorporated by reference.

BACKGROUND OF THE INVENTION

1. Field of the Invention

The present invention relates to a planographic printing plate. More particularly, the present invention relates to a planographic printing plate which can effect developing with water or directly producing a printing plate by operating an infrared laser according to digital signals without developing.

2. Description of the Related Art

Conventionally, various methods have been known for producing a printing plate directly from digitalized image data via no lith film, for example, (1) a method using an electrophotographic method; (2) a method using a highly sensitive photopolymer which can be inscribed by a laser having relatively low output which emits blue or green light; (3) a method using a silver salt or a complex system of a silver salt with other system, and (4) a method in which an acid is generated by exposure to a heat mode laser and a thermoset image is obtained by post-heating using the acid as a catalyst.

Though these methods are extremely useful for simplifying a printing process, they are not necessarily fully satisfactory. For example, the method (1) using an electrophotographic method is complicated in image forming processes such as charging, exposure, developing and the like, and the apparatus used for this method is complicated and large in scale. In the method (2) using a photopolymer, handling in bright room is difficult since the printing plate has high sensitivity. In the method (3) using a silver salt, there are some defects in that the treatment is complicated, silver is included in a treatment waste solution, and the like. The method (4) is also complicated since post-heating and developing treatment thereafter are necessary.

Further, the production method for these printing plates include, after the exposure process, a wet developing process for removing a recording layer made on the surface of a substrate to leave an image-wise concave, and a post-treating process in which a developed printing plate is washed with washing-water and treated with a rinse solution containing a surfactant and a desensitizing solution containing gum arabic and a starch derivative.

On the other hand, in recent plate producing and printing arts, environmental problems are noticed since development waste solutions exhibit an alkaline character. Further, simplification of plate production works have been developed. There is a need for a printing plate which does not require the complicated wet developing treatment as described above and can be used for printing after exposure without any treatment.

Regarding the printing plate which does not require developing treatment after exposure of an image, for example, U.S. Pat. No. 5,258,263 which discloses a planographic printing plate which is formed by laminating a photosensitive hydrophobic layer and a photosensitive hydrophilic layer on a substrate, of which curing or insolubilizing is promoted in an exposed range. However, this plate is a printing plate of so-called on-printer-developing type in which a unexposed part of a photosensitive layer is removed during a printing process, and has the defect that it pollutes wetting water and printing ink. Further, in this plate, adhesion between the photosensitive hydrophilic layer and the photosensitive hydrophobic layer is problematical due to its two-layer structure, and there is a defect that a lot of prints can not be printed.

As a planographic printing plate which does not require wet developing treatment after formation of an image, there are disclosed printing plates having a silicone layer and a laser heat sensitive layer below the layer in U.S. Pat. Nos. 5,353,705 and 5,379,698. Although these plates do not require wet developing, they have the defect that rubbing and treatment with a special roller are necessary for completing removal of the silicone layer by laser abrasion, and the treatment is complicated.

There is disclosed a system in which a film obtained by sulfonation of polyolefins is used, and hydrophilicity of the surface thereof is changed by thermal inscription to form a planographic printing plate which does not require developing treatment in Japanese Patent Application Laid-Open (JP-A) Nos. 5-77,574, 4-125,189 and 62-195,646 and U.S. Pat. No. 5,187,047. In this system, a sulfonic group on the printing plate is de-sulfonated by thermal inscription to form an image. Thus developing treatment is not required, however, there is a defect that a harmful gas is generated in the thermal inscription.

U.S. Pat. Nos. 5,102,771 and 5,225,316 suggest a planographic printing plate obtained by combining a photo acid-generating agent with a polymer carrying an acid sensitive group on a side chain, namely a no-developing system. This planographic plate has a defect that it has only limited hydrophilicity since the acid generated is a carboxylic acid and consequently, is poor in durability of the plate and brightness of the printed image.

JP-A No. 7-186,562 (EP 652,483) discloses a planographic printing plate containing an infrared absorbing pigment and a polymer which generates a carboxylic acid by action of heat and acid. However, a planographic plate using this planographic printing plate has a problem that stain is made in printing.

SUMMARY OF THE INVENTION

One object of the present invention is to provide a planographic printing plate having high sensitivity.

Particularly, an object of the present invention is to provide a planographic printing plate which has high sensitivity and can be developed with water or does not require special treatment such as rubbing and wet developing treatment after exposure of an image.

Another object of the present invention is to provide a planographic printing plate which can produce a plate directly from digital data by recording using a semiconductor laser or solid laser which emits an infrared ray and does not require special treatment such as rubbing and wet developing treatment after exposure of an image and particularly, can be developed with water.

The present inventors have found that the above-described object and other objects of the present invention can be accomplished by the following planographic printing plates.

i) A planographic printing plate comprising a substrate having thereon a recording layer containing a polymer compound carrying on a side chain a functional group which generates sulfonic acid in the presence of an acid, base or heat, selected from a group consisting of the following general formulae (1) to (3):

$$-L^1-SO_2-O-R^1 \quad (1)$$

wherein $L^1$ represents a first group comprised of a polyvalent non-metal atom which connects a first unit represented by the general formula (1) to a polymer backbone, and $R^1$ represents a substituted or unsubstituted aryl group, a substituted or unsubstituted alkyl group or cyclic imide group;

$$-L^2-SO_2-SO_2-R^2 \quad (2)$$

wherein $L^2$ represents a second organic group comprised of a polyvalent non-metal atom which connects a second unit represented by the general formula (2) to a polymer backbone, and $R^2$ represents a substituted or unsubstituted aryl group or a substituted or unsubstituted alkyl group; and

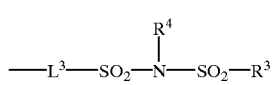

$$-L^3-SO_2-\underset{R^4}{N}-SO_2-R^3 \quad (3)$$

wherein $L^3$ represents a third organic group comprised of a polyvalent non-metal atom which connects a third unit represented by the general formula (3) to a polymer backbone, $R^3$ represents a substituted or unsubstituted aryl group or a substituted or unsubstituted alkyl group, $R^4$ represents a substituted or unsubstituted aryl group, a substituted or unsubstituted alkyl group or $R^5$, and $R^5$ represents a substituted or unsubstituted aryl group or a substituted or unsubstituted alkyl group.

ii) The planographic printing plate of i), in which the recording layer comprises a polymer compound carrying on a side chain a functional group selected from a group consisting of the general formulae (1) to (3) on the substrate, and any one of a photo acid-generating agent or acid-generating agent, thermal base-generating agent and infrared ray absorbing agent.

iii) The planographic printing plate according to i), in which the polymer compound has functional groups represented by the general formula (1) or (2) and is a polymer compound carrying on a side chain a functional group which generates sulfonic acid in the presence of an acid, and the recording layer further comprises a photo acid-generating agent.

iv) The planographic printing plate according to i), in which the polymer compound is a polymer compound carrying on a side chain a functional group which generates sulfonic acid in the presence of a base, and the recording layer further comprises a thermal base-generating agent.

v) The planographic printing plate according to iv), in which the functional group is represented by the general formula (1).

vi) The planographic printing plate according to i), in which the polymer compound is a polymer compound carrying on a side chain a functional group which generates sulfonic acid in the presence of heat, and the recording layer further comprises an infrared ray absorbing agent.

vii) The planographic printing plate according to vi), in which the functional group is selected from at least one functional group represented by the general formula (1), (2) or (3).

viii) The planographic printing plate according to i), in which the polymer compound is a polymer compound carrying on a side chain a functional group which generates sulfonic acid in the presence of heat, and the recording layer comprises an infrared ray absorbing agent and an acid-generating agent, and ix) The planographic printing plate according to viii), in which the functional group is selected from at least one functional group represented by the general formula (1) or (2).

When a polymer carrying a functional group having the structure as described above is used, stability with the passage of time is excellent. Particularly, when the polymer carrying a functional group having the structure as described above is combined with an acid-generating agent, stability with the passage of time is superior as compared with that obtained by combining an acid-generating agent with a polymer of benzyl ester type described in JP-A No. 4-121, 748.

DESCRIPTION OF THE PREFERRED EMBODIMENTS

The present invention will be described in detail below.

The planographic printing plate of the present invention comprises a substrate having thereon a recording layer containing a photosensitive composition, and main components constituting the recording layer are described below.

The present invention comprises a substrate having thereon a recording layer containing an image recording material, and contains as the image recording material a polymer compound carrying on a side chain a functional group which generates sulfonic acid under influence of an acid, base or heat (hereinafter, referred to as a sulfonic acid generating polymer compound).

The image recording material of the present invention may further advantageously contain any one of a photo acid-generating agent or acid-generating agent; thermal base-generating agent; or infrared absorbing agent. Alternatively, the image recording material of the present invention may advantageously contain a photo acid-generating agent or acid-generating agent and an infrared absorbing agent. Further, the image recording material of the present invention may advantageously contain also a thermal base-generating agent and an infrared absorbing agent.

[sulfonic acid generating type polymer compound]

The sulfonic acid generating type polymer compound used in the present invention may include polymer compounds carrying on a side chain a functional group represented by the general formula (1), (2) or (3).

The polymer compounds containing at least one of functional groups represented by the general formula (1), (2) and (3) in the present invention are described more specifically below.

When a photo acid-generating agent or acid generating agent is used together, a polymer represented by the general formula (1) or (2) is preferably used as the polymer carrying on a side chain a functional group which generates sulfonic acid.

Further, when a thermal base-generating agent is used together, a polymer represented by the general formula (1) or (2) is preferably used as the polymer carrying on a side chain a functional group which generates sulfonic acid.

Further, when an infrared absorbing agent is used together, a polymer represented by the general formula (1), (2) or (3) is preferably used as the polymer carrying on a side chain a functional group which generates sulfonic acid.

When $R^1$ to $R^5$ represent an aryl group or substituted aryl group, the aryl group may include a carbo-cyclic aryl group and a heterocyclic (hetero) aryl group. The carbo-cyclic aryl group used may include cyclic groups having 6 to 19 carbon atoms such as a phenyl group, naphthyl group, anthracenyl group, pyrenyl group and the like. The hetero cyclic aryl group used may include cyclic groups having 3 to 20 carbon atoms and 1 to 5 hetero atoms such as pyridyl group, furyl group, quinolyl group with which a benzene group is condensed, benzofuryl group, thioxanthone group, carbazole group and the like. When $R^1$ to $R^5$ represent an alkyl group or substituted alkyl group, the alkyl group used may include straight, branched or cyclic groups having 1 to 25 carbon atoms such as a methyl group, ethyl group, isopropyl group, t-butyl group, cyclohexyl group and the like.

When $R^1$ to $R^5$ represent a substituted aryl group, substituted hetero aryl group or substituted alkyl group, examples of the substituent may include an alkoxy group having 1 to 10 carbon atoms such as a methoxy group, ethoxy group and the like, halogen atoms such as a fluorine atom, chlorine atom, bromine atom and the like, alkyl groups substituted with halogen such as trifluoromethyl group and trichloromethyl group, alkoxycarbonyl groups having 2 to 15 carbon atoms such as a methoxy carbonyl group, ethoxy carbonyl group, t-butyloxy carbonyl group, p-chlorophenyloxy carbonyl group and the like or aryloxy carbonyl groups; hydroxyl group; acyloxy groups such as an acetyloxy group, benzoyloxy group, p-diphenylaminobenzoyloxy group and the like; carbonate groups such as a t-butyloxycarbonyloxy group and the like; ether groups such as a t-butyloxycarbonylmethyloxy group, 2-pyranyloxy group and the like; substituted or unsubstituted amino groups such as an amino group, dimethylamino group, diphenylamino group, morpholino group, acetylamino group and the like; thio ether groups such as a methylthio group, phenylthio group and the like; alkenyl groups such as a vinyl group, styryl group and the like; nitro group; cyano group; acyl groups such as a formyl group, acetyl group, benzoyl group and the like; aryl groups such as a phenyl group, naphthyl group and the like; hetero aryl groups such as a pyridyl group and the like. When $R^1$ to $R^5$ represent a substituted aryl group or substituted hetero aryl group, the substituent which can be used may include alkyl groups such as a methyl group, ethyl group and the like in addition to the above-described groups.

When $R^1$ represents a cyclic imide group, the cyclic imide which can be used may include imides having 4 to 20 carbon atoms such as succinic imide, phthalic imide, cyclohexane dicarboxylic imide, norbornene dicarboxylic imide and the like.

Particularly preferable examples of $R^1$ may include aryl groups substituted with an electron attractive group such as halogen, cyano, nitro and the like, alkyl groups substituted with an electron attractive group such as halogen, cyano, nitro and the like, secondary or tertiary branched alkyl groups, cyclic alkyl groups and cyclic imides.

Particularly preferable examples of $R^2$ to $R^5$ may include aryl groups substituted with an electron attractive group such as halogen, cyano, nitro and the like, alkyl groups substituted with an electron attractive group such as halogen, cyano, nitro and the like, and secondary or tertiary branched alkyl groups.

The polyvalent connecting group comprising of a nonmetal atom represented by $L^1$ to $L^3$ is comprised of 1 to 60 carbon atoms, 0 to 10 nitrogen atoms, 0 to 50 oxygen atoms, 1 to 100 hydrogen atoms, and 0 to 20 sulfur atoms. More specific examples of the connecting group may include those constituted by combination of the following structural units.

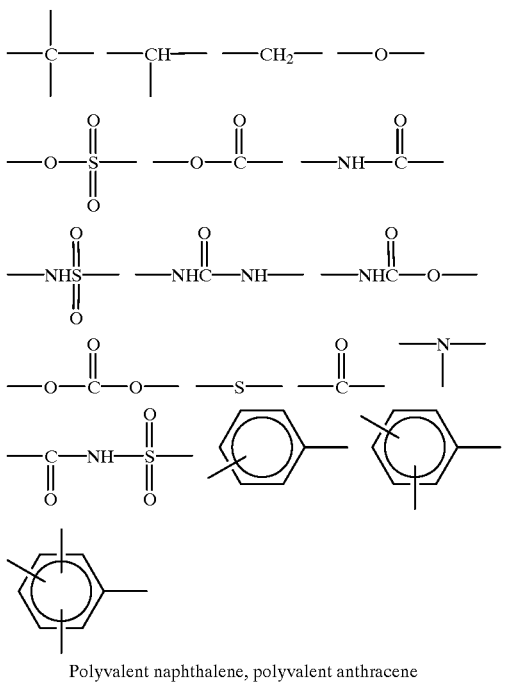

Polyvalent naphthalene, polyvalent anthracene

When the polyvalent connecting group has a substituent, there can be used as the substituent alkyl groups having 1 to 20 carbon atoms such as a methyl group, ethyl group and the like, aryl groups having 6 to 16 carbon atoms such as a phenyl group, naphthyl group and the like, acyloxy groups having 1 to 6 carbon atoms such as a hydroxyl group, a carboxyl group, a sulfonamide group, a N-sulfonylamide group, an acetoxy group and the like, alkoxy groups having 1 to 6 carbon atoms such as a methoxy group, ethoxy group and the like, halogen atoms such as chlorine, bromine and the like, alkoxycarbonyl groups having 2 to 7 carbon atoms such as a methoxycarbonyl group, ethoxycarbonyl group, cyclohexyloxycarbonyl group and the like, carbonate groups such as a cyano group, t-butyl carbonate and the like.

Specific examples of the monomer suitably used for synthesis of the polymer compound carrying on a side chain a functional group represented by the general formula (1), (2) or (3) according to the present invention are described below.

When a photo acid-generating agent or acid generating agent is used together, the following A-(1) to A-(23) are preferably used as the polymer compound carrying on a side chain a functional group represented by the general formula (1) or (2).

Further, when a thermal base-generating agent is used together, the following A-(1) to A-(16), A-(23) and A-(24) are preferably used as the polymer compound carrying on a side chain a functional group represented by the general formula (1).

Further, when an infrared absorbing agent is used together, the following A-(1) to A-(19), and A-(23) to A-(31) are preferably used as the polymer compound carrying on a side chain a functional group represented by the general formula (1), (2) or (3).

Further, when a photo acid-generating agent or acid generating agent and an infrared absorbing agent or a thermal base-generating agent and an infrared absorbing agent are used together, the following A-(1) to A-(23) are preferably used.

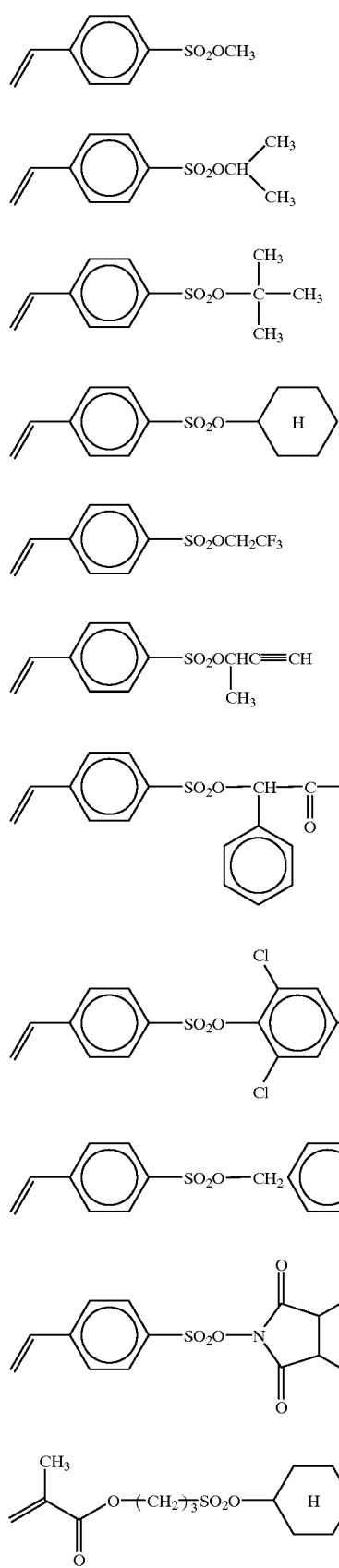
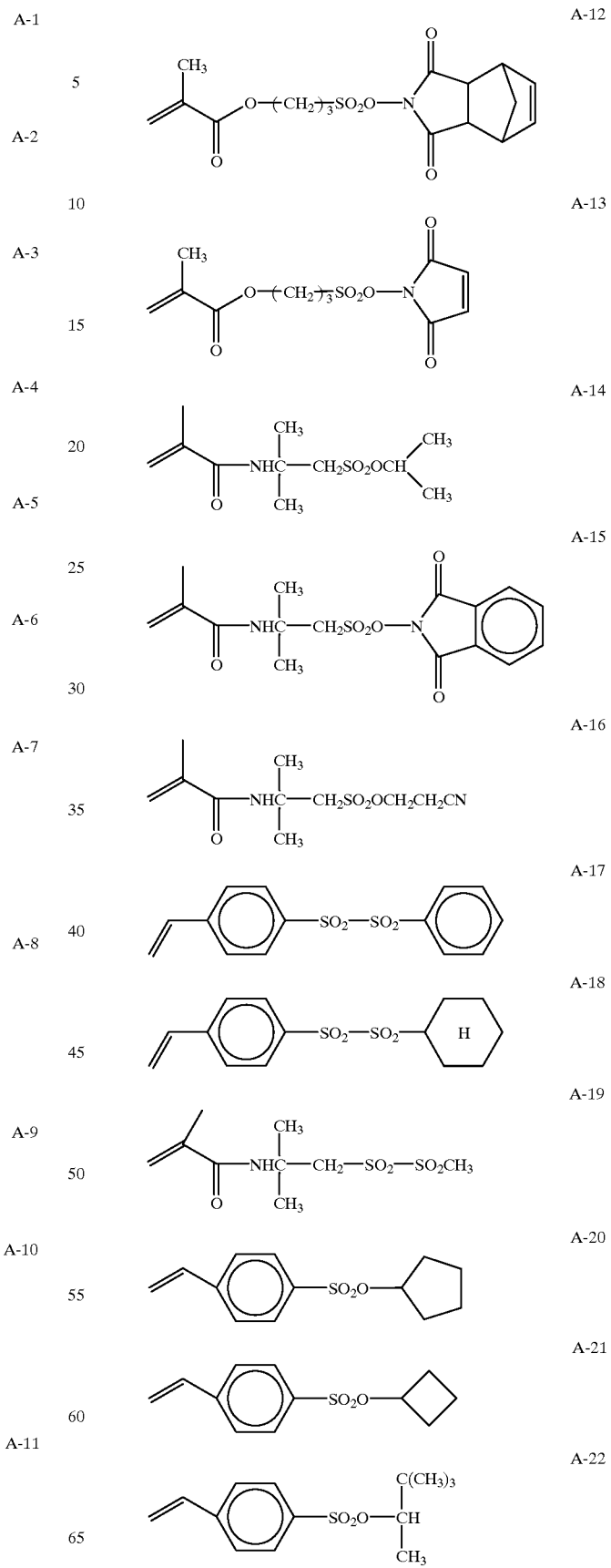

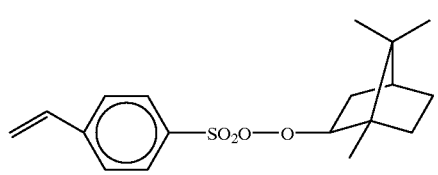 A-23
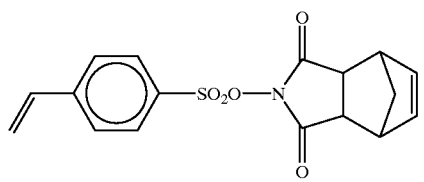 A-24
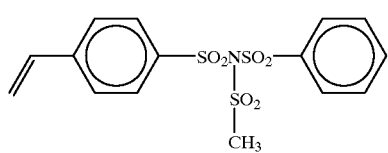 A-25
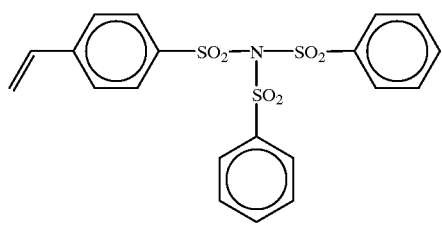 A-26
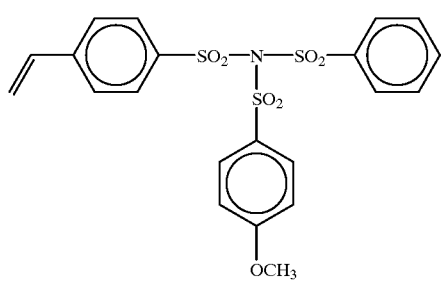 A-27
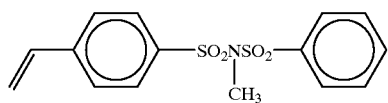 A-28
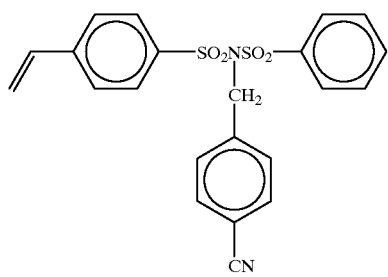 A-29
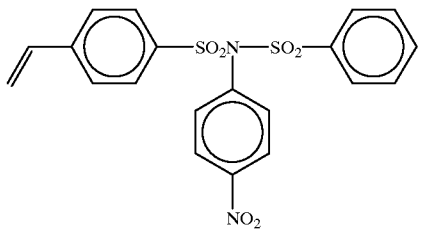 A-30
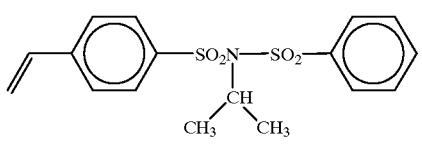 A-31
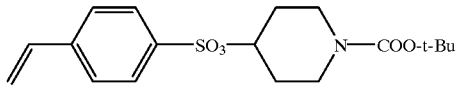 A-32
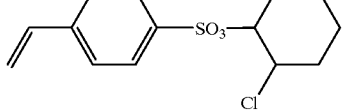 A-33
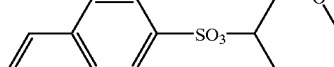 A-34
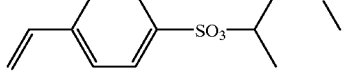 A-35
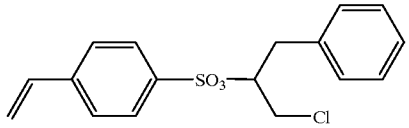 A-36
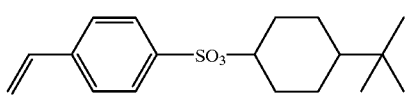 A-37
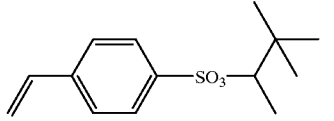 A-38
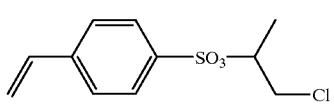 A-39
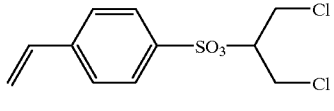 A-40
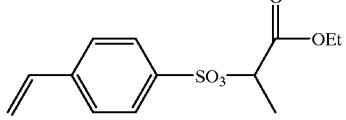

-continued

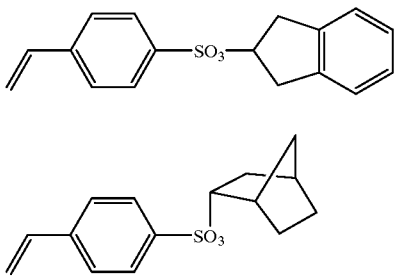

A-41

A-42

In the present invention, a polymer compound is preferably used which is obtained by radical polymerization of at least any one of monomers having a functional group represented by the general formula (1), (2) or (3). As such a polymer compound, there may be used a homopolymer using only one of monomers having a functional group represented by the general formula (1), (2) or (3). There may also be used a copolymer using two or more of them or copolymer comprised of the above-described monomer with other monomer.

In the present invention, the polymer compound which is further suitably used is a copolymer which is obtained by radical polymerization of the above-described monomer with other known monomer.

The other monomer may preferably include monomers having crosslinkable property such as glycidyl methacrylate, N-methylol methacrylate, omega-(trimethoxysilyl)propyl methacrylate, 2-isocyanate ethyl acrylate and the like.

The other monomer used in the copolymer may also include known monomers such as acrylates, methacrylates, acrylamides, methacrylamides, vinyl esters, styrenes, acrylic acid, methacrylic acid, acrylonitrile, maleic anhydride, maleic imide and the like.

Specific examples of the acrylates may include methyl acrylate, ethyl acrylate, (n- or i-)propyl acrylate, (n-, i-, sec- or t-) butyl acrylate, amyl acrylate, 2 -ethylhexyl acrylate, dodecyl acrylate, chloroethyl acrylate, 2-hydroxyethyl acrylate, 2-hydroxypropyl acrylate, 5-hydroxypentyl acrylate, cyclohexyl acrylate, allyl acrylate, trimethylolpropane monoacrylate, pentaerythritol monoacrylate, benzyl acrylate, methoxybenzyl acrylate, chlorobenzyl acrylate, hydroxybenzyl acrylate, hydroxyphenetyl acrylate, dihydroxyphenetyl acrylate, furfuryl acrylate, tetrahydrofurfuryl acrylate, phenyl acrylate, hydroxyphenyl acrylate, chlorophenyl acrylate, sulfamoylphenyl acrylate, 2-(hydroxyphenylcarbonyloxy)ethyl acrylate and the like.

Specific examples of the methacrylate may include methyl methacrylate, ethyl methacrylate, (n- or i-)propyl methacrylate, (n-, i-, sec- or t-)butyl methacrylate, amyl methacrylate, 2-ethylhexyl methacrylate, dodecyl methacrylate, chloroethyl methacrylate, 2-hydroxyethyl methacrylate, 2-hydroxypropyl methacrylate, 5-hydroxypentyl methacrylate, cyclohexyl methacrylate, allyl methacrylate, trimethylolpropane monomethacrylate, pentaerythritol monomethacrylate, glycidyl methacrylate, benzyl methacrylate, methoxybenzyl methacrylate, chlorobenzyl methacrylate, hydroxybenzyl methacrylate, hydroxyphenethyl methacrylate, hydroxyphenethyl methacrylate, furfuryl methacrylate, tetrahydrofurfuryl methacrylate, phenyl methacrylate, hydroxyphenyl methacrylate, chlorophenyl methacrylate, sulfamoylphenyl methacrylate, 2-(hydroxyphenylcarbonyloxy)ethyl methacrylate and the like.

Specific examples of the acrylamides may include acrylamide, N-methylacrylamide, N-ethylacrylamide, N-propylacrylamide, N-butylacrylamide, N-benzylacrylamide, N-hydroxyethylacrylamide, N-phenylacrylamide, N-tolylacrylamide, N-(hydroxyphenyl)acrylamide, N-(sulfamoylphenyl)acrylamide, N-(phenylsulfonyl)acrylamide, N-(tolylsulfonyl)acrylamide, N,N-dimethylacrylamide, N-methyl-N-phenylacrylamide, N-hydroxyethyl-N-methylacrylamide and the like.

Specific examples of the methacrylamides may include methacrylamide, N-methylmethacrylamide, N-ethylmethacrylamide, N-propylmethacrylamide, N-butylmethacrylamide, N-benzylmethacrylamide, N-hydroxyethylmethacrylamide, N-phenylmethacrylamide, N-tolylmethacrylamide, N-(hydroxyphenyl)methacrylamide, N-(sulfamoylphenyl)methacrylamide, N-(phenylsulfonyl)methacrylamide, N-(tolylsulfonyl)methacrylamide, N,N-dimethylmethacrylamide, N-methyl-N-phenylmethacrylamide, N-hydroxyethyl-N-methylmethacrylamide and the like.

Specific examples of the vinyl esters may include vinyl acetate, vinyl butylate, vinyl benzoate and the like.

Specific examples of the styrenes may include styrene, methylstyrene, dimethylstyrene, trimethylstyrene, ethylstyrene, propylstyrene, cyclohexylstyrene, chloromethylstyrene, trifluoromethylstyrene, ethoxymethylstyrene, acetoxymethylstyrene, methoxystyrene, dimethoxystyrene, chlorostyrene, dichlorostyrene, bromostyrene, iodostyrene, fluorostyrene, carboxystyrene and the like.

Examples which are particularly preferably used among these other monomers may include acrylates, methacrylates, acrylamides, methacrylamides, vinyl esters, styrenes, acrylic acid, methacrylic acid and acrylonitrile having up to 20 carbon atoms.

The other monomer having crosslinkable property preferably include glycidyl methacrylate, N-methylolmethacrylamide, omega-(trimethoxysilyl)propyl methacrylate, 2-isocyanate ethyl acrylate and the like.

The proportion of the constitutional unit represented by the general formula (1) or (2) contained in the copolymer obtained by using these monomers is preferably 6% by mol or more, and further preferably 31% by mol or more. When it is less than 6% by mol, developing is impossible, and when lower than 31% by mol, there is a possibility that a film that remains after development is formed.

The proportion of the monomer having a functional group represented by the general formulae (1) to (3) used for synthesis of a copolymer may be advantageously 5% by weight or more, for example, preferably from 5 to 99% by weight, and further preferably 10% by weight or more, and for example, may advantageously be from 10 to 95% by weight.

Specific examples of the polymer compound carrying on a side chain a functional group represented by the general formula (1) to (3) include, but are not limited to the following compounds. Number in the formula represents molar composition of a polymer compound.

When a thermal base-generating agent is used together, the following B-1 to B-9 are preferably used.

Further, when an infrared absorbing agent is used together, the following B-1 to B-13 are preferably used.

Further, when an acid-generating agent and infrared absorbing agent are used together, the following B-1 to B-2, B-8 to B-9 and B-14 to B-21 are preferably used.

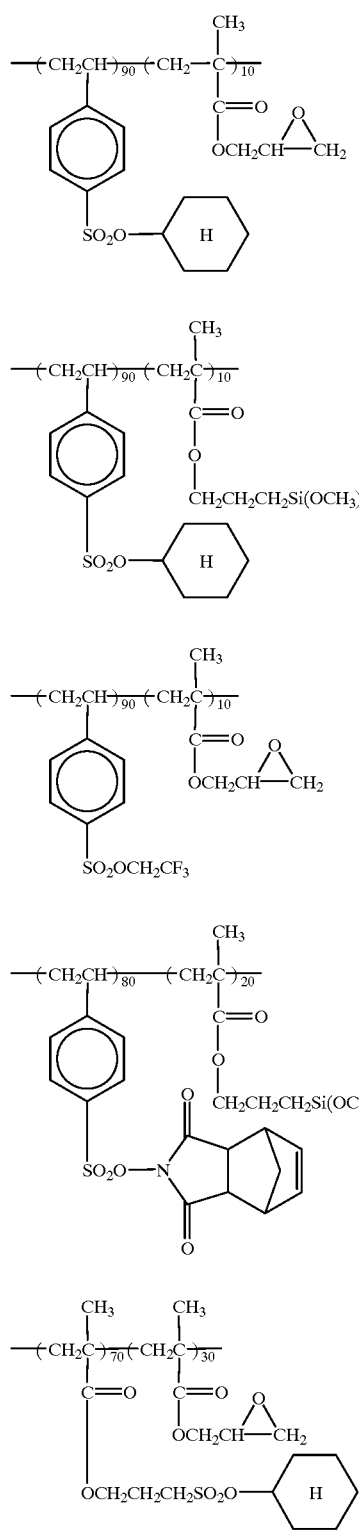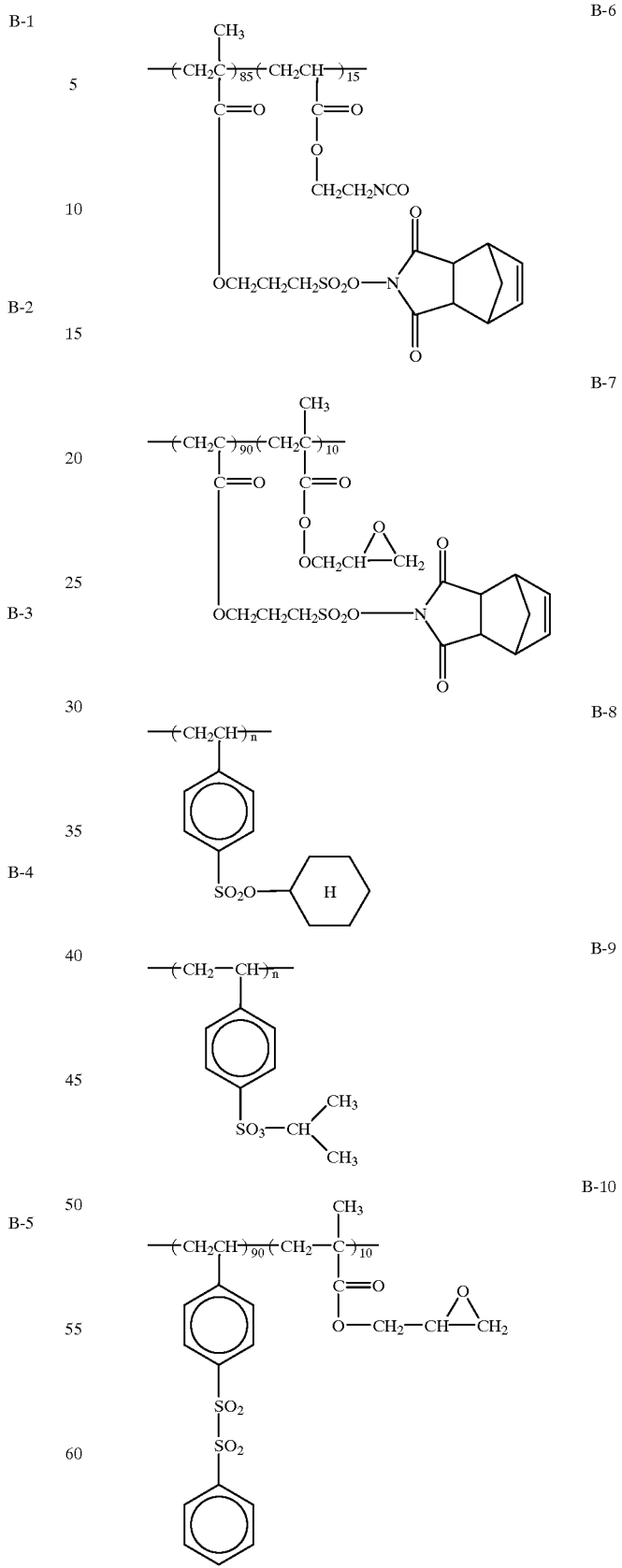

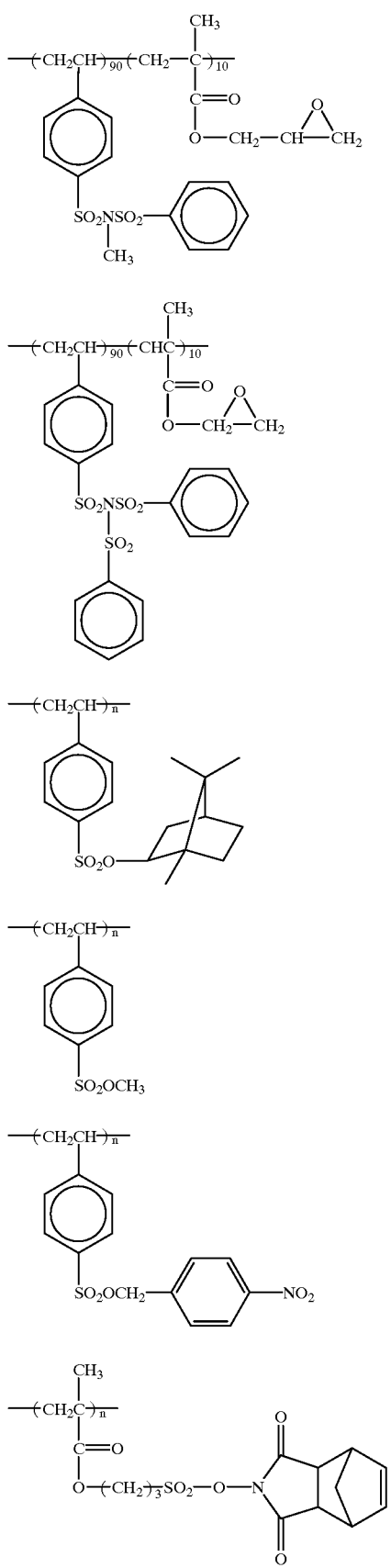

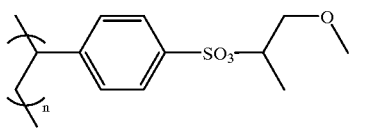
B-24

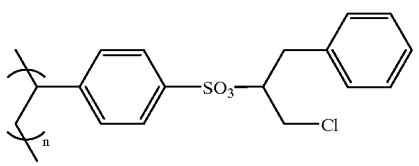
B-25

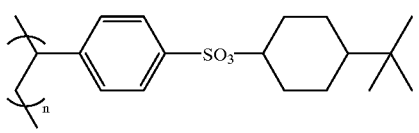
B-26

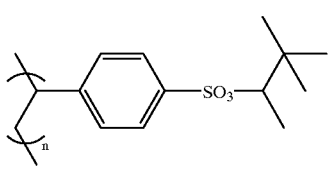
B-27

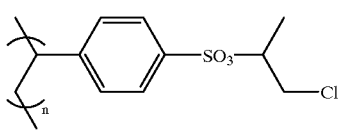
B-28

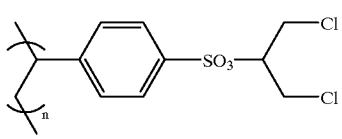
B-29

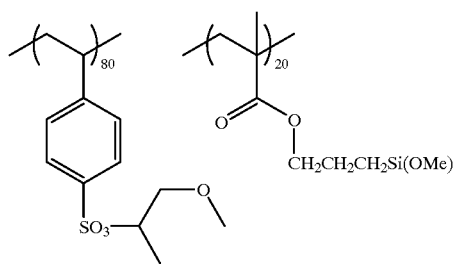
B-30

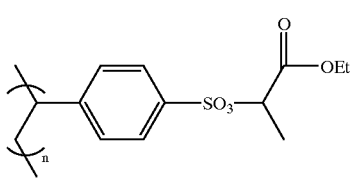
B-31

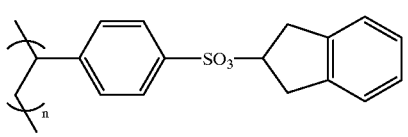
B-32

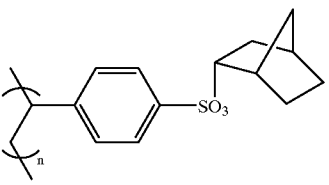
B-33

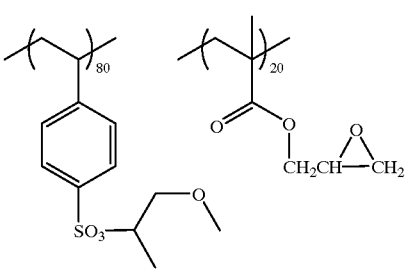
B-34

The weight average molecular weight of the polymer compound having at least any one of functional groups represented by the general formulae (1) to (3) used in the present invention is preferably 2000 or more, and further preferably from 5000 to 300000, and the number average molecular weight is preferably 800 or more, and further preferably from 1000 to 250000. The degree of polydispersion (weight average molecular weight/number average molecular weight) is preferably 1 or more, and further preferably from 1.1 to 10.

The polymer compound like this may be any of a random polymer, block polymer, graft polymer and the like, and preferably is a random polymer.

The solvent used in synthesis of the sulfonic acid generating type polymer compound used in the present invention includes tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimetyl acetate, 1-methoxy-2-propanol, 1-methoxy-2-propylacetate, N,N-dimethylformaldehyde, N,N-dimethylacetamide, toluene, ethyl acetate, methyl lactate, ethyl lactate, dimethylsulfoxide, water and the like. These solvents may be used alone or in combination thereof.

The radical polymerization initiator used in synthesis of the sulfonic acid generating type polymer compound used in the present invention may include known compounds such as azo-based initiators, peroxide initiators and the like.

The polymer compounds used in the present invention may be used alone or in combination. The amount of these polymer compounds added into an image recording material is from 25 to 98% by weight, and preferably from 50 to 97%, more preferably from 60 to 90% by weight based on the total solid components of the image recording material. When the amount added is less than 25% by weight, the printed image is unclear. On the other hand, when the amount added is over 98% by weight, the image formation can not sufficiently be effected. To obtain a fully clear image, the compound may advantageously be added into the image recording material in a proportion from 60 to 97% by weight.

[thermal base-generating agent]

As the thermal base-generating agent, there are preferably used a salt of a base with an organic acid which is decarbonated to be decomposed by heating, a compounds which is decomposed to release amines by a reaction such as an intramolecular nucleophilic substitution reaction, Lossen rearrangement, Beckmann rearrangement and the like, and a compound which causes some reaction by heating to release a base. The preferable thermal base-generating agent include salts of trichloroacetic acid described in BP No. 998, 949, salts of α-sulfonylacetic acid described in U.S. Pat. No. 4,060,420, salts of propiolic acids and 2-carboxycarboxamide derivative, described in JP-A No. 59-157,637, salts with a heat-decomposable acid using an alkaline metal or alkaline earth metal in addition to an organic base as a base component described in JP-A No. 59-168,440, hydroxame carbamates obtained by using Lossen rearrangement described in JP-A No. 59-180,537, aldoxime carbamates which generate nitrile by heating described in JP-A No. 59-195,237, and the like. In addition, thermal base generating agents described in BP No. 998, 945, U.S. Pat. No. 3,220,846, BP No. 279,480, JP-A Nos. 50-22,625, 61-32,844, 61-51,139, 61-52,638, 61-51,140, 61-53,634 to 61-53,640, 61-55,644, 61-55,645 and the like are useful.

The thermal base-generating agent which is particularly useful in the present invention may include guanidine trichloroacetate, methylguanidinetrichloroacetate, potassium trichloroacetate, guanidine phenylsulfonylacetate, guanidine p-chlorophenylsulfonylacetate, guanidine p-methanesulfonylphenylsulfonylacetate, potassium phenylpropiolate, guanidine phenylpropiolate, cesium phenylpropiolate, guanidine p-chlorophenylpropiolate, guanidine p-phenylene-bis-phenylpropiolate, tetramethylammonium phenylsulfonylacetate and tetramethylammonium phenylpropiolate.

The above-described thermal base-generating agents can be used in wide range. The useful range is not more than 50% by weight in terms of weight of the total coated film, and further preferably in the range from 0.01% by weight to 20% by weight.

Further, when the thermal base-generating agent is used, the recording layer may further advantageously contain an infrared absorbing agent described below.

[Infrared ray absorbing agents]

Infrared ray absorbing agents used in the present invention are a dye or pigment effectively absorbing an infrared ray having a wavelength of 760 nm to 1,200 nm. It is preferable that the dye or pigment having an absorption maximum between the wavelengths of 760 nm and 1,200 nm.

As dyes, known dyes commercially available or those disclosed in the literature (such as "Senryo Binran (Dye Handbook)" edited by Yuki Gosei Kagaku Kyokai (organic Synthetic Chemistry Association), published in 1970, can be used. Specifically, examples may include azo dyes, metal complex azo dyes, pyrazolone azo dyes, anthraquinone dyes, phthalocyanine dyes, carbonium dyes, quinoneimine dyes, methyne dyes, cyanine dyes, and metal thiolate complexes.

Examples of preferable dyes may include cyanine dyes disclosed in JP-A Nos. 58-125,246, 59-84,356, 59-202,829, and 60-78,787; methyne dyes disclosed in JP-A Nos. 58-173,696, 58-181,690, and 58-194,595; naphthoquinone dyes disclosed in JP-A Nos. 58-112,793, 58-224,793, 59-48, 187, 59-73,996, 60-52,940, and 60-63,744; squalilium dyes disclosed in JP-A No. 58-112,792; and cyanine dyes disclosed in U.K. Patent No. 434,875.

Furthermore, near infrared absorption sensitizing agents disclosed in U.S. Pat. No. 5,156,938 can be preferably used. Moreover, substituted aryl benzo(thio)pyrylium salts disclosed in U.S. Pat. No. 3,881,924; trimethyne thiapyrylium salts disclosed in JP-A No. 57-142,645 (U.S. Pat. No. 4,327,169); pyrylium-containing compounds disclosed in JP-A Nos. 58-181,051, 58-220,143, 59-41,363, 59-84,248, 59-84,249, 59-146,063, and 59-146,061; cyanine dyes disclosed in JP-A No. 59-216,146; pentamethyne thiopyrylium salts disclosed in U.S. Pat. No. 4,283,475; and pyrylium compounds disclosed in JP-B Nos. 5-13,514 and 5-19,702 can be preferably used as well.

As other examples of preferable dyes, near infrared absorption dyes disclosed in U.S. Pat. No. 4,756,993 represented by formulas (I) and (II) can be presented.

Among these dyes, particularly preferable are cyanine dyes, squalilium dyes, pyrylium salts, and nickel thiolate complexes.

Pigments usable in the present invention may include commercially available pigments and those disclosed in the Color Index (C. I.) Manual, "Saishin Ganryo Binran (Modern Pigment Manual)" edited by Nippon Ganryo Gijutsu Kyokai (Japan Pigment Technology Association), published in 1977; "Saishin Ganryo Oyo Gijutsu (Modern Pigment Application Technology)" by CMC Press, published in 1986; and "Insatsu Ink Gijutsu (Printing Ink Technology)" by CMC Press, published in 1984.

Examples of pigments may include black pigments, yellow pigments, orange pigments, brown pigments, red pigments, purple pigments, blue pigments, green pigments, fluorescent pigments, metal powder pigments, and polymer bond pigments. Specifically, insoluble azo pigments, azo lake pigments, condensation azo pigments, chelate azo pigment, phthalocyanine pigments, anthraquinone pigments, perylene and perynone pigments, thioindigo pigments, quinacridone pigments, dioxazine pigments, isoindolinone pigments, quinophthalone pigments, colored lake pigments, azine pigments, nitroso pigments, nitro pigments, natural pigments, fluorescent pigments, inorganic pigments, and carbon black can be used. Among these examples, carbon black is preferable.

These pigments can be used without surface treatment, or can be used after being applied with surface treatment. Examples of surface treatment methods may include a method of surface coating with a resin or a wax, a method of adhering a surfactant, and a method of bonding a reactive substance (such as a silane coupling agent, and epoxy compound, and polyisocyanate) with the pigment surface. The above-mentioned surface treatment methods are disclosed in "Kinzokusekken no Sishitsu to Oyo (Natures and Applications of Metal Soaps)" by Sachi Press; "Insatsu Ink Gijutsu (Printing Ink Technology)" by CMC Press; published in 1984; and "Saishin Ganryo Oyo Gijutsu (Modern Pigment Application Technology)" by CMC Press, published in 1986.

A pigment particle size of 0.01 $\mu$m to 10 $\mu$m is preferable, 0.05 $\mu$m to 1 $\mu$m is more preferable, and 0.1 $\mu$m to 1 $\mu$m is the most preferable. A pigment particle size smaller than 0.01 $\mu$m is not preferable in terms of the stability of the pigment dispersion in a photosensitive layer coating solution. On the other hand, a pigment particle size larger than 10 $\mu$m is not preferable in terms of the uniformity of the image recording layer.

As methods of dispersing a pigment, known dispersing methods employed in ink production or toner production can be used. Examples of dispersing machine may include ultrasonic dispersing machines, and sand mills, attritors, pearl mills, super mills, ball mills, impellers, dispersers, KD mills, colloid mills, dynatrons, triple roll mills, and pressure kneaders. Details thereof are described in "Saishin Ganryo Oyo Gijutsu (Modern Pigment Application Technology)" by CMC Press, published in 1986.

These dyes or pigments can be added in an image recording material in an amount of 0.01 to 50% by weight based on the weight of the total solid component of the image recording material, preferably in an amount of 0.1 to 10% by weight, more preferably in an amount of 0.5 to 10% by weight in the case of a dye, and more preferably in an amount of 3.1 to 10% by weight in the case of a pigment. An amount of a pigment or dye less than 0,01% by weight causes low sensitivity. On the other hand, an amount more than 50% by weight produces stains in a nonimage portion at the time of printing.

[Acid-generating agent] or [Photo acid-generating agent]

The acid-generating agent or photo acid-generating agent contained in the recording layer of the printing plate of the present invention indicates a compound which is decomposed to generate an acid by irradiation with a light or radiation. As the acid-generating agent or photo acid-generating agent, known agents can be suitably selected and used.

As the acid-generating agent or photo acid-generating agent used in the present invention, an agent having an absorption at a wavelength of 400 nm or more is preferred, and further, there can even be used an agent having no absorption at 400 nm or more provided it generates an acid by being combined with a sensitizer having an absorption at 400 nm or more. When the agent having no absorption at 400 nm or more is used without being combined with a given sensitizer, the sensitivity is liable to decrease.

In the present invention, images can be formed when the above-described sulfonic acid-generating type polymer compound is combined with the above-described infrared ray absorbing agent, and further, when the above-described acid-generating agent or photo acid-generating acid is added, sensitivity of a planographic printing plate increases and a non-image portion is not easily polluted.

As the acid-generating agent or photo acid-generating agent, known agents can be used.

Examples thereof may include diazonium salts described in S. I. Schlesinger, Photogr. Sci. Eng., 18, 387 (1974), T. S. Bal et al., Polymer, 21, 423 (1980) and the like, ammonium salts described in U.S. Pat. Nos. 4,069,055, 4,069,056, JP-A No. 3-140,140 and the like, phosphonium salts described in D. C. Necker et al., Macromolecules, 17, 2468 (1984), C. S. Wen et al., Tech, Proc. Conf. Rad. Curing ASIA, p478, Tokyo, October (1988), U.S. Pat. Nos. 4,069,055, 4,069,056 and the like, iodonium salts described in J. V. Crivello et al., Macromolecules, 10 (6), 1307 (1977), Chem. & Eng. News, November 28, p31 (1988), EP No. 104,143, U.S. Pat. No. 4,837,124, JP-A Nos. 2-150,848, 2-296,514 and the like, sulfonium salts described in J. V. Crivello et al., Polymer J. 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14 (5), 1141 (1981), J. V. Crivello et al., J. Polymer Sci., Polymer Chem. Ed., 17, 2877 (1979), EP No. 370, 693, U.S. Pat. No. 3,902,114, EP Nos. 233,567, 297,443, 297,442, 422,570, 279,210, U.S. Pat. Nos. 4,933,377, 4,760,013, 4,734,444, 2,833,827, DE Patent Nos. 2,904,626, 3,604,580, 3,604,581 and the like, selenonium salts described in J. V. Crivello et al., Macromolecules, 10 (6), 1307 (1977), J. V. Crivello et al., J. Polymer Sci., Polymer Chem. Ed., 17, 1047 (1979) and the like, onium salts such as an arsonium salt and the like described in C. S. Wen et al., Tech, Proc. Conf. Rad. Curing ASIA, p478, Tokyo, October (1988) and the like, organic halogen compounds described in U.S. Pat. No. 3,905,815, JP-B No. 46-4,605, JP-A Nos. 48-36,281, 55-32, 070, 60-239,736, 61-169,835, 61-169,837, 62-58,241, 62-212,401, 63-70,243, 63-298,339 and the like, organometal/organic halogen compounds described in K. Meier et al., J. Rad. Curing, 13 (4), 26 (1986), T. P. Gill et al., Inorg. Chem., 19, 3007 (1980), D. Astruc, Acc. Chem. Res., 19 (12), 377 (1896), JP-A No. 2-161,445 and the like, photo acid-generating agents having an O-nitrobenzyl type protecting group described in S. Hayase et al., J. Polymer Sci., 25,753 (1987), E. Reichmanis et al., J. Polymer Sci., Polymer Chem. Ed., 23, 1 (1985), Q. Q. Zhu et al., J. Photochem., 36, 85, 39, 317 (1987), B. Amit et al., Tetrahedron Lett., (24) 2205 (1973), D. H. R. Barton et al., J. Chem. Soc., 3571 (1965), P. M. Collins et al., J. Chem. Soc., Perkin I, 1965 (1975), M. Rudinstein et al., Tetrahedron Lett., (17), 1445 (1975), J. W. Walker et al., J. Am. Chem. Soc., 110, 7170 (1988), S. C. Busman et al., J. Imaging Technol., 11 (4), 191 (1985), H. M. Houlihan et al., macromolecules, 21, 2001 (1988), P. M. Collins et al., J. Chem. Soc., Chem. Commun., 532 (1972), S. Hayase et al., Macromolecules, 18, 1799 (1985), E. Reichmanis et al., J. Electrochem. Soc., Solid State Sci. Technol., 130 (6), F. M. Houlihan et al., Macromolecules, 21, 2001 (1988), EP Nos. 0,290,750, 046,083, 156,535, 271,851, 0,388,343, U.S. Pat. Nos. 3,901,710, 4,181,531, JP-A Nos. 60-198,538, 53-133, 022 and the like, compounds which are photo-decomposed to generate sulfonic acid represented by iminosulfonate and the like described in M. TUNOOKA et al., Polymer Preprints Japan, 35 (8), G. Berner et al., J. Rad. Curing, 13 (4), W. J. Mijs et al., Coating Technol., 55 (697), 45 (1983), Akzo, H. Adachi et al., Polymer Preprints, Japan, 37 (3), EP Nos. 0,199,672, 84,515, 199,672, 044,115, 0,101,122, U.S. Pat. Nos. 4,618,564, 4,371,605, 4,431,774, JP-A Nos. 64-18, 143, 2-245,756, 4-365,048 and the like, disulfone compounds described in JP-A No. 61-166,544, o-naphthoquinone diazide-4-sulfonic halides described in JP-A No. 50-36,209 (U.S. Pat. No. 3,969,118), o-naphthoquinone diazide compounds described in JP-A No. 55-62,444 (BP No. 2,038,801) and JP-B No. 1-11,935.

Among the above-described compounds which are decomposed to generate an acid by irradiation with the active ray or radiation, compounds which are effectively used are described below.

(1) Oxazole derivatives which are represented by the following general formula (PAG1) or S-triazine derivatives which are represented by the following general formula (PAG2) having substitution by a trihalomethyl group.

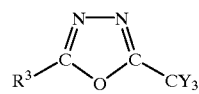
(PAG1)

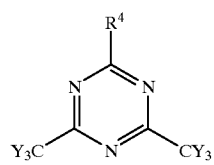
(PAG2)

In the formulae, $R^3$ represents a substituted or unsubstituted aryl group or alkenyl group, and $R^4$ represents a substituted or unsubstituted aryl group, alkenyl group, alkyl group or —$CY_3$. Y represents a chlorine atom or bromine atom.

Specific examples include, but are not limited to, the following compounds.

(PAG1-1) 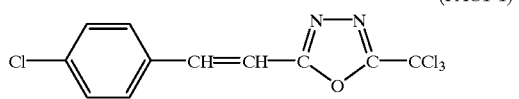

(PAG1-2) 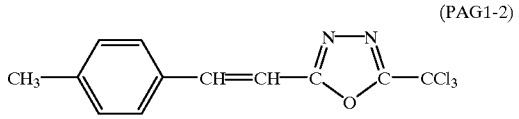

(PAG2-1) 

(PAG2-2) 

(PAG2-3) 

(PAG2-4) 

(PAG2-5) 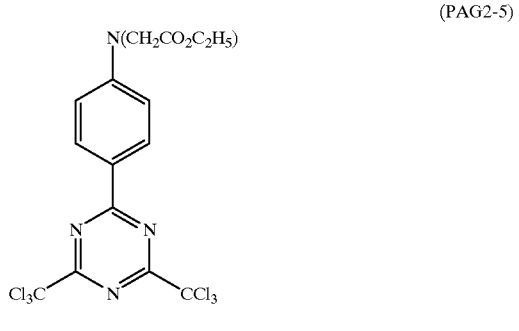

(2) Iodonium salts represented by the following general formula (PAG3) or sulfonium salts or diazonium salts represented by the following general formula (PAG4).

(PAG3)

(PAG4)

In the formulae, each of $Ar^1$ and $Ar^2$ represents independently a substituted or unsubstituted aryl group. The preferable substituent may include an alkyl group, haloalkyl group, cycloalkyl group, aryl group, alkoxy group, nitro group, carboxyl group, alkoxycarbonyl group, hydroxy group, mercapto group and halogen atom.

Each of $R^5$, $R^6$ and $R^7$ represents independently a substituted or unsubstituted alkyl group or aryl group. Preferable examples thereof may include an aryl group having 6 to 14 carbon atoms, alkyl group having 1 to 8 carbon atoms and substituted derivatives thereof. The preferable substituent may include an alkoxy group having 1 to 8 carbon atoms, alkyl group having 1 to 8 carbon atoms, nitro group, carboxyl group, hydroxyl group and halogen group for the aryl group, and an alkoxy group having 1 to 8 carbon atoms, carboxyl group and alkoxycarbonyl group for the alkyl group.

$Z^-$ represents an anion pair, and examples thereof may include, but not limited to, perfluoroalkanesulfonic acid anion anions such as $BF_4^-$, $AsF_6^-$, $PF_6^-$, $AbF_6^-$, $SiF_6^{2-}$, $ClO_4^-$, $CF_3SO_3^-$ and the like, a pentafluorobenzenesulfonic acid anion, connected polynuclear aromatic sulfonic acid anions such as a naphthalene-1-sulfonic acid anion and the like, an anthraquinonesulfonic acid anion, sulfonic group-containing dyes and the like.

Further, two of $R^5$, $R^6$ and $R^7$, and $Ar^1$ and $Ar^2$ may be bonded via a single bond thereof or a substituent.

Specific examples thereof may include, but not limited to, the following compounds.

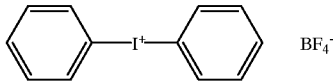
(PAG3-1)

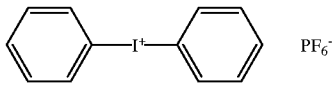
(PAG3-2)

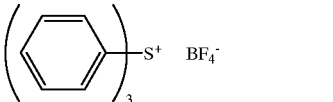
(PAG4-1)

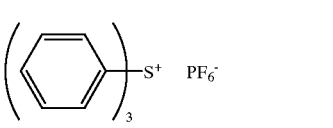
(PAG4-2)

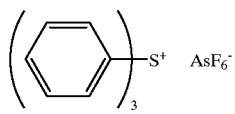
(PAG4-3)

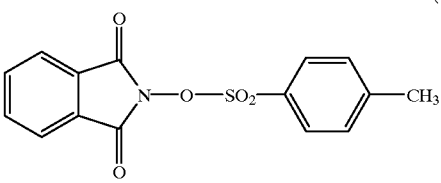
(PAG6-2)

The above-described onium salts represented by the general formulae (PAG3) and (PAG4) are known, and can be synthesized, for example, by methods described in J. W. Knapczyk et al., J. Am. Chem. Soc., 91, 145 (1969), A. L. Maycok et al., J. Org. Chem., 35, 2532, (1970), B. Goethas et al., Bull. Soc. Chem. Belg., 73, 546 (1964), H. M. Leicester, J. Ame. Chem. Soc., 51, 3587 (1929), J. V. Crivello et al., J. Polym. Chem. Ed., 18, 2677 (1980), U.S. Pat. Nos. 2,807,648 and 4,247,473, JP-A No. 53-101,331 and the like.

(3) Disulfone derivatives represented by the following general formula (PAG5) or iminosulfonate derivatives represented by the following formula (PAG6).

$$Ar^3—SO_2—SO_2—Ar^4 \quad (PAG5)$$

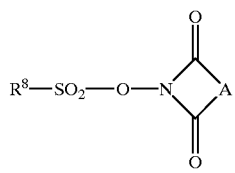
(PAG6)

In the formulae, each of $Ar^3$ and $Ar^4$ represents independently a substituted or unsubstituted aryl group. $R^8$ represents a substituted or unsubstituted alkyl group or aryl group. A represents a substituted or unsubstituted alkylene group, alkenylene group or arylene group.

Specific examples thereof may include, but are not limited to, the following compounds.

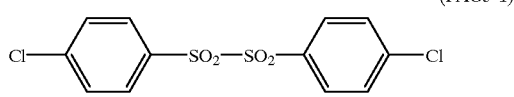
(PAG5-1)

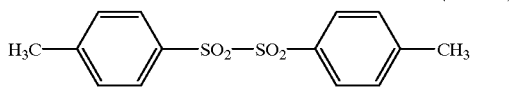
(PAG5-2)

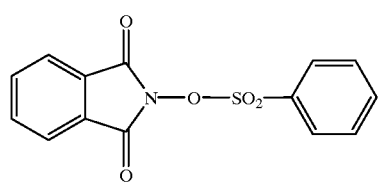
(PAG6-1)

The content of these acid-generating agents or photo acid-generating agents in the total solid component of the image recording material is usually from 0.1 to 30% by weight, and more preferably from 1 to 15% by weight. When the content is less than 1%, sensitivity is low, and when the content is over 15%, image strength decreases.

[Other components]

In the present invention, though the afore-said components are described to be contained in the recording layer, various compounds may be optionally added other than the afore-said components. They are described below.

DYE; A dye having a large absorption in the visible light region can be used as the coloring agent.

Specifically, examples may include Oil Yellow #101, Oil Yellow #103, Oil Pink #312, Oil Green BG, Oil Blue BOS, Oil Blue #603, Oil Black BY, Oil Black BS, Oil Black T-505 (manufactured by Orient Chemical Industry, Co., Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and dyes disclosed in JP-A No.62-293,247 and Japanese Patent Application No. 7-335,145.

It is preferable to add these dyes for easily distinguishing the image portion and the non-image portion because of discoloration after laser irradiation.

The amount to be added is from 0.01 to 20% by weight, preferably from 0.1 to 20% by weight, and more preferably from 1.0 to 15% by weight based on the total solid component of the image recording material.

In order to enable stable treatment regardless of the fluctuation in development conditions, a nonionic surfactant disclosed in JP-A Nos. 62-251,740 and 3-208,514 and an ampholytic surfactant disclosed in JP-A Nos. 59-121,044 and 4-13,149 can be added to an image recording layer of the present invention.

Examples of nonionic surfactants may include sorbitan tristearate, sorbitan monopalmitate, sorbitan triolate, mono glyceride stearate, and polyoxyethylene nonylphenyl ether.

Examples of ampholytic surfactants may include alkyl di(aminoethyl)glycine, alkyl polyaminoethylglycine hydrochloride, 2-alkyl-N-carboxyethyl-N-hydroxyethyl imidazolinium betaine, and N-tetradecyl-N,N-substituted betaine (for example, Amorgen K manufactured by Dai-Ichi Kogyo Co., Ltd.).

The amount of the above-described nonionic surfactants and ampholytic surfactants is preferably from 0.05 to 15% by weight, and more preferably from 0.1 to 5% by weight in an image recording material.

In order to provide flexibility to the film, etc., a plasticizer can be added as needed to the image recording layer of the present invention. Examples of a plasticizer may include polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, an oligomer and a polymer of acrylic acid or methacrylic acid.

In addition to these examples, epoxy compounds, vinyl ethers, phenol compounds having an alkoxy methyl group and phenol compounds having a hydroxymethyl group disclosed in Japanese Patent Application No. 7-18,120, can also be added. Other polymer compound can be added in order to increase the strength of the film.

The planographic printing plate of the present invention can be produced, in general, by dissolving the above-described component in a solvent and applying the resultant solution to an appropriate support. Solvents used herein may include, but are not limited to, ethylene dichloride, cyclohexanone, methyl ethyl ketone, methanol, ethanol, propanol, ethylene glycol monomethyl ether, 1-methoxy-2-propanol, 2-methoxy ethyl acetate, 1-methoxy-2-propyl acetate, dimethoxyethane, methyl lactate, ethyl lactate, N,N-dimethyl acetamide, N,N-dimethyl formamide, tetramethyl urea, N-methyl pyrrolidone, dimethyl sulfoxide, sulfolane, y-butyrolactone, toluene and water.

These solvents are used alone or in combinations thereof. The concentration of the above-described components (total solid component including additives) is preferably from 1 to 50% by weight in the solution. The application amount (solid component) on the support obtained after applying and drying is determined according to the application purpose. However, as to the planographic printing plate, in general, 0.5 to 5.0 g/m$^2$ is preferable. As a method of application, various methods can be used, such as bar coater application, rotation application, spray application, curtain application, dip application, air knife application, blade application, and roll application.

A surfactant for improving the applicability, such as a fluorine-containing surfactant disclosed in JP-A No. 62-170,950 can be added to an image recording layer of the present invention. An addition amount is preferably from 0.01 to 1% by weight based on the total solid component of the image recording material, and more preferably from 0.05 to 0.5% by weight.

[Matting layer]

It is preferable that a matting layer is made on the surface of the photosensitive layer made as described above, to shorten the time for pressure reduction in contact irradiation using a vacuum baking frame and to prevent baking fogging. Specific examples thereof may include a method in which a matting layer is made as described in JP-A No. 50-125,805, JP-B Nos. 57-6,582 and 61-28,986, a method in which a solid powder is heat-melted as described in JP-B No. 62-62,337, and the like.

It is preferable that a support used in the present invention is a dimensionally stable plate-like substance. As this method, there can be suitably used those which have been used as a substrate for a printing plate. Examples thereof may include paper, paper laminated with plastic (such as polyethylene, polypropylene, and polystyrene), metal plates (such as aluminum (including aluminum alloy), zinc, and copper), plastic films (such as cellulose diacetate, cellulose triacetate, cellulose propionate, cellulose butyrate, cellulose acetate/butyrate, cellulose nitrate, polyethylene terephthalate, polyethylene, polystyrene, polypropylene, polycarbonate, and polyvinyl acetal), and paper or plastic film laminated or deposited with the above-described metals.

A polyester film or an aluminum plate is preferable as a support in the present invention. In particular, an aluminum plate is preferable since it has good dimensional stability and can be provided at a relatively low cost. Examples of preferable aluminum plates may include pure aluminum plates and alloy plates comprising aluminum as the main component and trace qualities of a different element. Furthermore, plastic films to which aluminum is laminated or deposited can also be used. Examples of different elements included in an aluminum alloy include silicon, iron, manganese, copper, magnesium, chrome, zinc, lead, bismuth, nickel, and titanium. An amount of the different element in the alloy is preferably 10% by weight or less. In the present invention, pure aluminum is particularly preferable. However, since production of a completely pure aluminum is difficult in terms of refining technology, aluminum containing trace qualities of a different element can be used. The composition of an aluminum plate applied in the present invention as mentioned above is not specifically defined, and a known aluminum plate can he also used. The thickness of an aluminum plate used in the present invention is from about 0.1 mm to 0.6 mm, preferably from 0.15 mm to 0.4 mm, and more preferably from 0.2 mm to 0.3 mm.

The substrate is optionally subjected to surface treatment. For example, in the case of a planographic printing plate, hydrophilicizing treatment is performed on the surface of the substrate.

Further, in the case of a substrate having a surface composed of metal, particularly aluminum, it is preferable that surface treatment such as graining treatment, immersion treatment in an aqueous solution of sodium silicate, potassium fluorinated zirconate, phosphate or the like, or anodizing treatment is performed. Further, there are also suitably used an aluminum plate obtained by immersion treatment in an aqueous sodium silicate solution after graining as disclosed in U.S. Pat. No. 2,714,066, and a plate obtained by immersion treatment in an aqueous solution of an alkaline metal silicate after anodizing treatment of an aluminum plate as described in U.S. Pat. No. 3,181,461. The above-described anodizing treatment is effected, for example, by applying an electric current using an aluminum plate as an anode in an electrolyte solution composed of one of or a combination of aqueous solutions or non-aqueous solutions of inorganic acids such as phosphoric acid, chromic acid, sulfuric acid, boric acid and the like, organic acids such as oxalic acid, sulfamic acid and the like or salts thereof.

Further, silicate electrodeposition as described in U.S. Pat. No. 3,658,662 is also effective.

These hydophilicization treatments are effected to prevent a harmful reaction with an image recording material provided on the substrate and to enhance adhesion with a recording layer in addition to hydrophilicizing the surface of the substrate.

Prior to graining of the aluminum plate, optionally, a drawing oil on the surface may be removed or pretreatment of the surface may be conducted to expose clean aluminum surface. For the former treatment, a solvent such as trichloroethylene or the like, a surfactant and the like are used. For the latter treatment, there are widely conducted methods using an alkali etching agent such as sodium hydroxide, potassium hydroxide or the like.

As the graining method, any of mechanical, chemical and electro chemical methods may be effective. As the mechanical method, a ball abrasion method, blast abrasion method, brush abrasion method in which a water-dispersed slurry of an abrasive such as pumice is rubbed with a nylon brush, and the like are listed, as the chemical method, immersion in a saturated aqueous solution of an aluminum salt of a mineral acid as described in JP-A No. 54-31,187 is suitable, and as the electrochemical method, a method in which alternate current electrolysis is effected in an acidic electrolyte solution composed of hydrochloric acid, sulfuric acid or a combination thereof is preferable. Among these roughening methods, in particular, a roughening method in which mechanical roughening is combined with electrochemical roughening as described in JP-A No. 55-137,993 is preferable since adhesion of a sensitive image to a substrate is strong.

The graining according to the above-described methods is preferably performed so that center line surface roughness (Ha) of the surface of an aluminum plate is in the range from 0.3 to 1.0µ.

The aluminum plate thus grained is optionally subjected to water-washing or chemical etching treatment.

The etching treatment solution is usually selected from aqueous solutions of bases or acids which dissolve aluminum. In this case, the solution must be such that there is formed on the etched surface a different coating from aluminum derived from etching solution components. Examples of the preferable etching agents may include sodium hydroxide, potassium hydroxide, trisodium phosphate, disodium phosphate, tripotassium phosphate, dipotassium phosphate and the like as a basic substance; and sulfuric acid, persulfuric acid, phosphoric acid, hydrochloric acid and salts thereof and the like as an acidic substance, however, salts of metal having lower ionization tendency than that of aluminum, for example, zinc, chromium, cobalt, nickel, copper and the like are not preferable since they form an unnecessary coating.

It is most preferable that these etching agents are used so that dissolving speed of aluminum or alloy used is from 0.3 to 40 $g/m^2$ per one minute of immersion according to the concentration used and setting of temperature, however, the dissolving speed over or less than this range may be possible without problems.

The etching is effected by immersing an aluminum plate in the above-described etching solution or applying the etching solution onto the aluminum plate, and it is preferable that the etching treatment is conducted so that the etching amount is from 0.5 to 10 $g/m^2$.

As the etching solution, it is desirable to use an aqueous solution of a base because eching speed is high. In this case, since smut is formed, a de-smut treatment is usually conducted. As an acid used for the de-smut treatment, nitric acid, sulfuric acid, phosphoric acid, chromic acid, hydrofluoric acid, fluoroboric acid and the like.

The aluminum plate which has been etched is optionally washed with water or anodized. The anodizing can be effected according to a method conventionally conducted in this field. Concretely, when direct or alternate current is applied to aluminum in an aqueous solution or non-aqueous solution composed of sulfuric acid, phosphoric acid, chromic acid, oxalic acid, sulfamic acid or benzenesulfonic acid or a combination of two or more of them, an anodized coating can be formed on the surface of an aluminum substrate.

The treatment conditions of the anodization can not be generally determined since they variously change depending on an electrolyte solution used, and in general, appropriately include a concentration of the electrolyte solution from 1 to 80% by weight, a temperature of the electrolyte solution from 5 to 70° C., a current concentration from 0.5 to 60 ampere/$dm^2$, a voltage from 1 to 100 V, and an electrolysis time from 30 seconds to 50 minutes.

Among these anodizing methods, a method which effects anodization at high current density in sulfuric acid described in BP No. 1,412,768, and a method which effects anodization using phosphoric acid as an electrolysis bath described in U.S. Pat. No. 3,511,611 are particularly preferable.

The aluminum plate which has been roughened and further anodized may be optionally subjected to hydrophilization treatment, and preferable examples thereof include methods in which the aluminum plate is treated with alkali metal silicates as described in U.S. Pat. Nos. 2,714,066 and 3,181,461, for example, an aqueous sodium silicate solution, potassium fluorinated zirconate disclosed in JP-B No. 36-22,063 or polyvinyl phosphonic acid as disclosed in U.S. Pat. No. 4,153,461.

Organic primer layer:

It is preferable that an organic primer layer is made before coating a recording layer on the planographic printing plate of the present invention, to decrease the residue of the recording layer in non-mage portion. Organic compounds used in this organic primer layer are selected from carboxy methylcellulose; dextrin; gum arabic; organic phosphonic acids which may be substituted, such as phosphonic acids having an amino group (for example, 2-amino ethyl phosphonic acid), phenyl phosphonic acid, naphthyl phosphonic acid, alkyl phosphonic acid, glycero phosphonic acid, methylene diphosphonic acid, and ethylene diphosphonic acid; organic phosphoric acid which may be substituted, such as phenyl phosphonic acid, naphthyl phosphoric acid, alkyl phosphoric acid, and glycerophosphoric acid; organic phosphinic acids which may be substituted, such as phenyl phosphinic acid, naphthyl phosphinic acid, alkyl phosphinic acid, and glycero-phosphinic acid; amino acids such as glycine and β-alanine; and hydrochlorides of amine having a hydroxy group, such as hydrochloride of triethanol amine. They can be used alone or in combination of two or more.

In addition, there can be used at least one compound selected from the group consisting of polymers having in the molecule a structural unit represented by the following general formula (4) such as poly(p-vinylbenzoic acid) and the like.

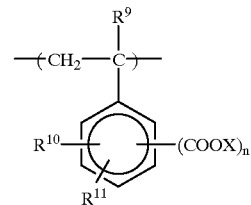

(4)

In the general formula (4), $R^9$ represents a hydrogen atom, halogen atom or alkyl group, and preferably a hydrogen atom, chlorine atom or alkyl group having 1 to 4 carbon atoms. A hydrogen atom or metal group is particularly preferable.

Each of $R^{10}$ and $R^{11}$ represents independently a hydrogen atom, hydroxyl group, halogen atom, alkyl group, substituted alkyl group, aromatic group, substituted aromatic group, —$R^{12}$, —$COOR^{13}$, —$CONHR^{14}$, —$COR^{15}$ or —CN, or $R^{10}$ and $R^{11}$ may also be combined together to form a ring. Each of $R^{12}$ to $R^{15}$ represents independently an alkyl group or aromatic group. More preferably, each of $R^{10}$ and $R^{11}$ represents independently a hydrogen atom, hydroxyl group, chlorine group, alkyl group having 1 to 4 carbon atoms, phenyl group, —$R^{12}$, —$COOR^{13}$, —$CONHR^{14}$, —$COR^{15}$ or —CN, and $R^{12}$ to $R^{15}$ each independently represents an alkyl group having 1 to 4 carbon atoms or phenyl group. In particular, each of $R^{10}$ and $R^{11}$ represents independently a hydrogen atom, hydroxyl group, methyl group or methoxy group.

X represents a hydrogen atom, metal atom or $NR^{16}R^{17}R^{18}R^{19}$, and, each of $R^{16}$ to $R^{19}$ represents independently a hydrogen atom, alkyl group, substituted alkyl group, aromatic group, substituted aromatic group, or $R^{16}$ and $R^{17}$ may be combined together to form a ring. More preferably, X represents a hydrogen atom, monovalent metal atom or $NR^{16}R^{17}R^{18}R^{19}$, and each of $R^{16}$ to $R^{19}$ represents independently a hydrogen atom, alkyl group having 1 to 4 carbon atoms or phenyl group. Particularly preferably, x represents a hydrogen atom, sodium, potassium or $NR^{16}R^{17}R^{18}R^{19}$, and $R^{16}$ to $R^{19}$ each independently represents a hydrogen atom, methyl group or ethyl group.

The mark n represents an integer from 1 to 3, preferably 1 or 2, and more preferably 1.

This organic primer layer can be made according to the following methods. Namely, there are a method in which a solution obtained by dissolving the above-described organic compound into water or an organic solvent such as methanol, ethanol, methyl ethyl ketone and the like or a mixed solvent thereof is applied on an aluminum plate and dried, and a method in which an aluminum plate is immersed into a solution obtained by dissolving the above-described organic compound into water or an organic solvent such as methanol, ethanol, methyl ethyl ketone and the like or a mixed solvent thereof, for adsorption of the above-described organic compound, then the plate is washed with water and the like and dried to give an organic primer layer. In the former method, a solution comprising the above-described organic compound in a concentration from 0.005 to 10% by weight can be applied by various methods. For example, any of a bar coater applying method, rotation applying method, spray applying method, curtain applying method and the like may be used. In the latter method, the concentration of the solution is from 0.01 to 20% by weight, and preferably from 0.05 to 5% by weight, and the immersion temperature is from 20 to 90° C., and preferably from 25 to 50° C., and the immersion time is from 0.1 second to 20 minutes, and preferably from 2 seconds to 1 minute.

The solution used herein may be used also in the pH range from 1 to 12 with controlling the pH value with a basic substance such as ammonia, triethylamine, potassium hydroxide or the like and an acidic substance such as hydrochloric acid, phosphoric acid or the like. Further, a yellow dye can also be added to improve reproducibility of tone of a planographic printing plate.

The amount coated after drying of the organic primer layer is suitably from 2 to 200 mg/m$^2$, and preferably from 5 to 100 mg/m$^2$. When the amount coated is less than 2 mg/m$^2$, sufficient printing resistance can not be obtained. Further, when it is over 200 mg/m$^2$, the same phenomenon occurs.

Back coat:

A back coat is optionally made on the rear surface of a substrate. As this back coat, there is preferably used a coating layer composed of a metal oxide obtained by hydrolysis and polycondensation of an organic polymer compound described in JP-A No. 5-45,885 or an organic or inorganic metal compound described in JP-A No. 6-35,174.

Among these coating layers, alkoxy compounds of silicon such as $Si(OCH_3)_4$, $Si(OC_2H_5)_4$, $Si(OC_3H_7)_4$, $Si(OC_4H_9)_4$ and the like are particularly preferable since they are cheap and easily available, and the resulted coating layer of a metal oxide has excellent hydrophilicity.

As heretofore mentioned, a planographic printing plate using an image recording material of the present invention can be produced. The planographic printing plate is exposed imagewise using a metal halide lamp, tungsten lamp, xenon lamp, mercury lamp, carbon arc lamp, visual or ultraviolet various lasers. For the exposure, there can also be used a solid laser and semiconductor laser which emits an infrared ray, in particular, an infrared ray having a wavelength of 760 nm to 1,200 nm. In the present invention, the exposed portion has a feature that is solubilized by moisture, therefore, there may be conducted developing with water after exposure, and optionally rubber drawing, then a plate may be installed to a printing machine and printing may be conducted. However, it is also possible that a plate is installed to a printing machine and a printing is conducted directly after exposure without conducting water-developing. Irrespective of the water-developing, it is preferable to conduct heat treatment after exposure in view of improvement in printing resistance of a printing plate.

When the water-developing is effected, a method in which water is poured on a plate by shower or a method in which a plate immersed in a water vessel may be applied, and in both cases, development can be sufficiently conducted by contact with water for 1 minute.

Preferable temperature and time of the heat treatment conducted after exposure are within a range from 80° C. to 200° C. for 10 seconds to 5 minutes, respectively. The laser energy necessary for recording in irradiation can be reduced by this heat treatment.

The planographic printing plate obtained by the treatment described above is subjected to water-developing or treated on an offset printing machine and used for printing of a lot of prints.

EXAMPLE

Example-I

The following examples further illustrate the present invention in detail, but do not limit the scope of the present invention.

[Synthesis of a polymer compound carrying on a side chain a functional group which generates sulfonic acid by heating]

Synthesis of monomer (compound A-4)

To a 500 ml three-necked flask were charged 200 ml of acetonitrile, 11 g of cyclohexyl alcohol and 8.8 g of pyridine and the mixture was stirred. To this was added dropwise 20.2 g of vinylbenzenesulfonyl chloride with cooling by ice. After the addition, the mixture was stirred for 2 hours at room temperature, when poured into 1 L of water and extracted with ethyl acetate. The extractant was dried with magnesium sulfate before vacuum distillation, and purified by column chromatography using a silica gel to give a compound A-4. Element analysis; calculated, C: 63.13%, H: 6.81%, observed, C: 63.01%, H: 6.85%.

Synthesis of synthetic polymer (I-1)

To a 200 ml three-necked flask were charged 20 g of a compound A-4 and 40 g of methyl ethyl ketone, and to this was added 0.25 g of azobisdimethylvaleronitrile under nitrogen flow at 65° C. The temperature was kept at this temperature for 5 hours with stirring, and then the solvent was distilled off under reduced pressure to give a solid. It was found that this solid was composed of a polymer having a weight average molecular weight of 104,000 by using GPC.

Synthesis of synthetic polymer (I-2) to (I-8)

Polymers were synthesized in the same manner as that for the polymer (I-1). All weight average molecular weights (GPC, based on polystyrene) were within the range from 10,000 to 30,000.

Synthesis of synthetic polymer (I-10)

To a 200 ml three-necked flask were charged 14.4 g of a compound A-4, 1.5 g of methacryloxypropyltrimethoxysilane (manufactured by Tokyo Kasei Corp.) and 40 g of methyl ethyl ketone, and to this was added 0.25 g of azobisdimethylvaleronitrile under nitrogen flow at 65° C.

The temperature was kept at this temperature for 6 hours with stirring, then the mixture was cooled to room temperature to give a solid. It was found that this solid was composed of a polymer having a weight average molecular weight of about 30,000 by using GPC.

Synthesis of synthetic polymer (I-9), (I-11), (I-12)

TABLE 1

| | | | Treatment (A) | | Treatment (B) | | Treatment (C) | | Treatment (D) | |
|---|---|---|---|---|---|---|---|---|---|---|
| Example | Material | Polymer Compound | Pollution In Non-Image Portion | Sensitivity | Pollution In Non-Image Portion | Sensitivity | Pollution In Non-Image Portion | Sensitivity | Pollution In Non-Image Portion | Sensitivity |
| Ex. 1 | I-A-1 | (I-1) | No Problems | 4 | No Problems | 8 | No Problems | 5 | No Problems | 9 |
| Ex. 2 | I-A-2 | (I-2) | No Problems | 4 | No Problems | 7 | No Problems | 4 | No Problems | 8 |
| Ex. 3 | I-A-3 | (I-3) | No Problems | 3 | No Problems | 6 | No Problems | 4 | No Problems | 7 |
| Ex. 4 | I-A-4 | (I-4) | No Problems | 4 | No Problems | 8 | No Problems | 4 | No Problems | 8 |
| Ex. 5 | I-A-5 | (I-5) | No Problems | 2 | No Problems | 6 | No Problems | 3 | No Problems | 6 |
| Ex. 6 | I-A-6 | (I-6) | No Problems | 4 | No Problems | 7 | No Problems | 5 | No Problems | 8 |
| Ex. 7 | I-A-7 | (I-7) | No Problems | 3 | No Problems | 6 | No Problems | 4 | No Problems | 8 |
| Ex. 8 | I-A-8 | (I-8) | No Problems | 4 | No Problems | 8 | No Problems | 5 | No Problems | 9 |

Polymers were synthesized in the same manner as that for the polymer (s-10). All weight average molecular weights (GPC, based on polystyrene) were within the range from 10,000 to 50,000.

Examples 1 to 8

An aluminum plate (material 1050) having a thickness of 0.30 mm was degreased by washing with trichloroethylene. A roughening treatment was applied to the aluminum plate by graining the surface with a nylon brush and a suspension in whch a 400-mesh powder of pumice stone is suspended in water, then washed with water. The plate was etched by being immersed in a 25% aqueous solution of sodium hydroxide of 45° C. for 9 seconds and washed with water. The plate was further immersed in a 2% $HNO_3$ for 20 seconds and washed with water. The etching amount of the grained surface was about 3 g/m$^2$. Then, the plate was provided with a direct current anodic oxidization film of 2.4 g/m$^2$ with 7% $H_2SO_4$ as the electrolyte and a current density of 15 A/dm$^2$, washed with water, and dried.

Then, 8 kinds of solutions (I-A-9 ) to (I-A-8) were prepared with changing the kind of the polymer compound carrying on a side chain a functional group which generates sulfonic acid in the presence of the acid according to the present invention, in the following solution (I-A). These solutions were respectively applied on aluminum plates which had been treated as described above, then the plates were dried for 3 minutes at 80° C. to give planographic printing plates (I-A-1) to (I-A-8) (Examples 1 to 8, respectively). The polymer compounds used are shown in Table 1. The amount applied after drying was 1.2 g/m$^2$.

Solution (I-A):

| | |
|---|---|
| Polymer compound of the present invention (shown in Table 1) | 1.0 g |
| o-naphthoquinone diazide-4-sulfonic chloride | 0.1 g |
| Dye obtained by substituting a counter ion of Victoria Pure Blue BOH with | 0.05 g |

-continued

Solution (I-A):

| | |
|---|---|
| 1-naphthalenesulfonic acid | |
| Fluorine-based surfactant (Megafack F-176PF, manufactured by Dainippon Ink & Chemicals, Inc.) | 0.06 g |
| Methyl ethyl ketone | 10 g |
| γ-butyrolactone | 10 g |

The structures of the polymer compounds used are shown below.

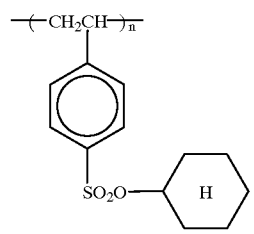

I-1

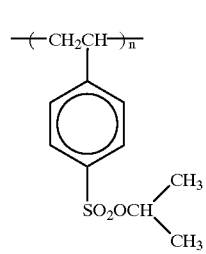

I-2

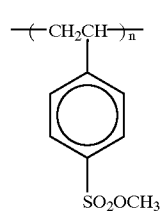

I-3

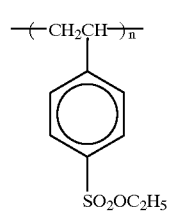

I-4

-continued

I-5
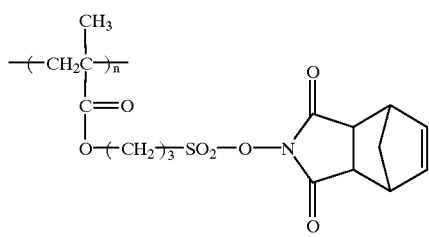

I-6
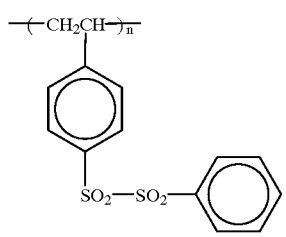

I-7
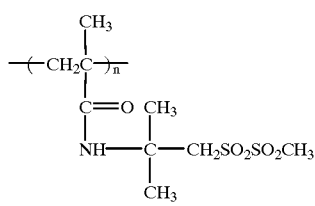

I-8
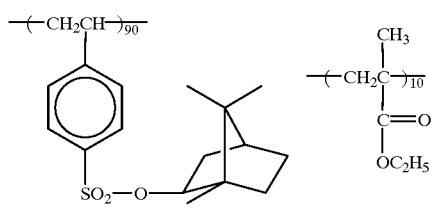

The resulting planographic printing plates I-A-1 to I-A-8 were irradiated with a metal halide lamp of 3 kw for 1 minute from a distance of 1 m through a step edge (difference in concentration between each step is 0.15) manufactured by Fuji Photo Film Co., Ltd. After the irradiation, the plates were developed with water and printed with Hydel SOR-M to obtain treatments (A) for evaluation. In the same manner, plates were heated for 3 minutes at 100° C., then developed with water and printed with Hydel SOR-M to obtain treatments (B), plates were printed with Hydel SOR-M without any pretreatment to obtain treatments (C), and plates were heated for 3 minutes at 100° C., then printed with Hydel SOR-M to obtain treatments (D) for evaluation. Since positive images were obtained, number of steps of the step edge on which the ink was completely adhered was calculated for evaluation of sensitivity (larger the number, higher the sensitivity). Occurrence of pollution derived from defects of a plate in non-image portion was observed. The results are shown in the above-described Table 1.

All of them were excellent prints, and among them, those printed after heating for 3 minutes at 100° C. had particularly excellent sensitivity.

Examples 9 to 12

Then, 4 kinds of solutions (I-B-1) to (I-B-4) were prepared with changing the kind of the polymer compound according to the present invention, in the following solution (I-B). These solutions were respectively applied on aluminum plates which had been treated used in Examples 1 to 8, then the plates were dried for 2 minutes at 100° C., then further heated for 1 hour at 100° C. to give planographic printing plates (I-B-1) to (I-B-4)(Examples 9 to 12, respectively). The polymer compounds used are shown in Table 2. The amount applied after drying was 1.7 g/m².

| Solution (I-B): | |
|---|---|
| Polymer compound of the present invention (shown in Table 2) | 1.6 g (based on solid) |
| Phthalic anhydride | 0.005 g |
| o-chlorophenol | 0.001 g |
| Dodecylbenzenesulfonate of 4-diazodiphenylamine | 0.15 g |
| Dye obtained by substituting a counter ion of Victoria Pure Blue BOH with 1-naphthalenesulfonic acid | 0.03 g |
| Fluorine-based surfactant (Megafack F-176PF, manufactured by Dainippon Ink & Chemicals, Inc.) | 0.06 g |
| Methyl ethyl ketone | 10 g |
| γ-butyrolactone | 10 g |

TABLE 2

| Ex- am- ple | Ma- terial | Poly- mer Com- pound | Treatment (A) | | Treatment (B) | |
|---|---|---|---|---|---|---|
| | | | Pollution In Non-Image Portion | Sensi- tivity | Pollution In Non-Image Portion | Sensi- tivity |
| Ex.9 | I-B-1 | (I-9) | No Problems | 5 | No Problems | 10 |
| Ex.10 | I-B-2 | (I-10) | No Problems | 4 | No Problems | 8 |
| Ex.11 | I-B-3 | (I-11) | No Problems | 5 | No Problems | 10 |
| Ex.12 | I-B-4 | (I-12) | No Problems | 3 | No Problems | 6 |

The structures of the polymer compounds used are shown below.

I-9
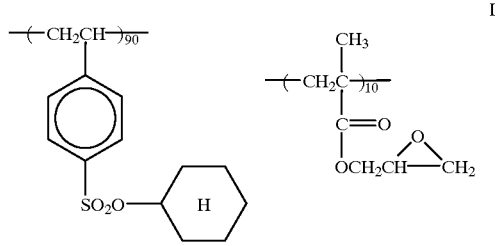

I-10
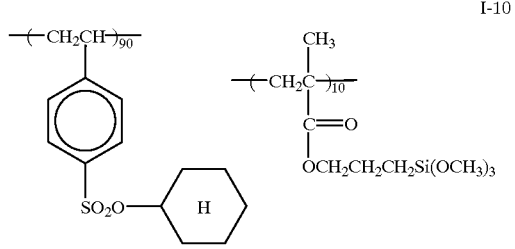

-continued

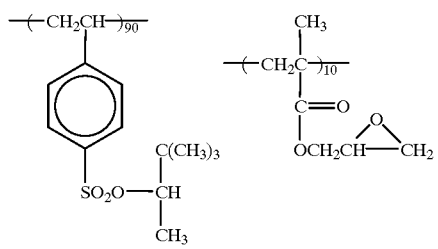

I-11

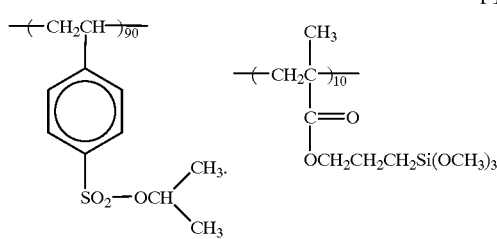

I-12

The resulting planographic printing plates I-B-1 to I-B-4 were irradiated with a metal halide lamp of 3 kw for 1 minute from a distance of 1 m through a step edge (difference in concentration between each step is 0.15) manufactured by Fuji Photo Film Co., Ltd. After the irradiation, the plates were printed with Hydel SOR-M without any pretreatment to obtain treatments (A), and the plates were heated for 3 minutes at 100 °C., then developed with water and printed with Hydel SOR-M to obtain treatments (B) for evaluation.

The evaluations were conducted in the same manner as in Examples 1 to 8, and the results are shown in the above-described Table 2 together.

All of them were excellent prints, and among them, those printed after heating for 3 minutes at 100° C. (treatment (B)) had particularly excellent sensitivity.

Examples 13 to 16 and Comparative Example 1

Solutions (I-C-1) to (I-C-4) were prepared with changing the kind of a photo acid-generating agent in the following solution (I-C). Further, a solution (I-C-5) was prepared containing no photo acid-generating agent as Comparative Example 1. These solutions were respectively applied on aluminum plates which had been treated used in Examples 1 to 8, then the plates were dried for 3 minutes at 80° C., to give planographic printing plates (I-C-1) to (I-C-5) (Examples 13 to 16 and Comparative Example 1, respectively). The photo acid-generating agents used are shown in Table 3. The amount applied after drying was 1.2 g/m².

| Solution (I-C): | |
|---|---|
| Polymer compound of the present invention (C-1) | 1.0 g |
| Photo acid-generating agent (shown in Table 3) | 0.1 g |
| Dye obtained by substituting a counter ion of Victoria Pure Blue BOH with 1-naphthalenesulfonic acid | 0.05 g |
| Fluorine-based surfactant (Megafack F-176PF, manufactured by Dainippon Ink & Chemicals, Inc.) | 0.06 g |

| Solution (I-C): | |
|---|---|
| Methyl ethyl ketone | 10 g |
| γ-butyrolactone | 10 g |

TABLE 3

| Example | Material | Photo Acid-Generating Agent | Pollution In Non-Image Portion | Sensitivity |
|---|---|---|---|---|
| Ex.13 | I-C-1 | X-(1) | No Problems | 9 |
| Ex.14 | I-C-2 | X-(2) | No Problems | 9 |
| Ex.15 | I-C-3 | X-(3) | No Problems | 10 |
| Ex.16 | I-C-4 | X-(4) | No Problems | 8 |
| Comp.1 | I-C-5 | None | No Image Obtained Due To Pollution | |

The structures of the photo acid-generating agent used are shown below.

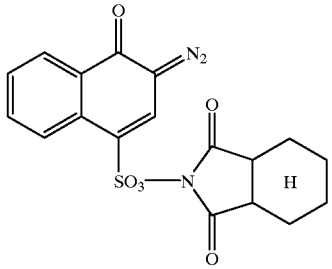

X-1

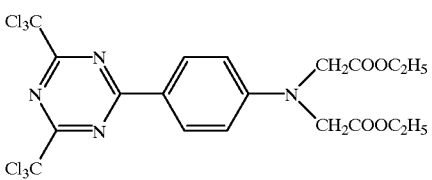

X-2

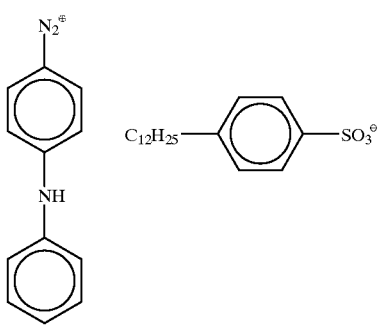

X-3

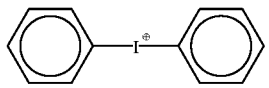

X-4

-continued

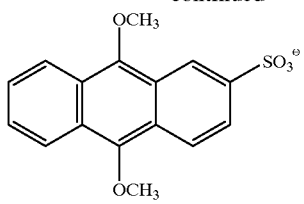

The resulting planographic printing plates I-C-1 to I-C-4 were irradiated with a metal halide lamp of 3 kw for 1 minute from a distance of 1 m through a step edge (difference in concentration between each step is 0.15) manufactured by Fuji Photo Film Co., Ltd. After the irradiation, the plates were heated for 3 minutes at 100° C. and then printed with Hydel SOR-M. Then, since positive images were obtained, number of steps of the step edge on which the ink was completely adhered was calculated for evaluation of sensitivity, and occurrence of pollution in non-image portion was observed. The results are shown in the above-described Table 3 together.

When the photo acid-generating agent was removed, an image was not obtained, on the other hand, when the photo acid-generating agent was added, any of the resulted prints was excellent one having high sensitivity.

Examples 17 and Comparative Example 2

Solutions (I-D-1) to (I-D-2) were prepared with changing the kind of the polymer compound and photo acid-generating agent, as shown in Table 4, in the following solution (I-D).

These solutions were respectively applied on aluminum plates which had been treated used in Examples 1 to 8, then the plates were dried for 3 minutes at 80° C. to give planographic printing plates (I-D-1) and (I-D-2) (Example 17 and Comparative Example 2, respectively). The polymer compounds and photo acid-generating agents used are shown in Table 4. The amount applied after drying was 1.2 g/m².

Solution (I-D):

| | |
|---|---|
| Polymer compound of the present invention (shown in Table 4) | 1.0 g |
| Photo acid-generating agent (shown in Table 4) | 0.1 g |
| Dye obtained by substituting a counter ion of Victoria Pure Blue BOH with 1-naphthalenesulfonic acid | 0.05 g |
| Fluorine-based surfactant (Megafack F-176PF, manufactured by Dainippon Ink & Chemicals, Inc.) | 0.06 g |
| Methyl ethyl ketone | 10 g |
| γ-butyrolactone | 10 g |

TABLE 4

| Example | Material | Polymer Compound | Photo Acid-Generating Agent | Sensitivity |
|---|---|---|---|---|
| Ex. 17 | I-D-1 | I-2 | O-Naphtho-quinone Diazide-4-Sulfonic Chloride | 5 |
| Comp. 2 | I-D-2 | Example 1 Of Us 5,225,316 | O-Naphtho-quinone Diazide-4-Sulfonic Chloride | 1 |

The polymer compounds and photo acid-generating agents used are shown in Table 4.

The resulting planographic printing plates I-D-1 to I-D-2 were irradiated with a metal halide lamp of 3 kw for 1 minute from a distance of 1 m through a step edge (difference in concentration between each step is 0.15) manufactured by Fuji Photo Film Co., Ltd. After the irradiation, the plates were heated for 3 minutes at 120° C., then immersed in water of 20 ° C. for 30 seconds for development. The resulted plate were printed with Hydel SOR-M. Then, number of the steps of the step edges on which the photosensitive layer began to remain was calculated for evaluation of sensitivity. Larger the number, higher the sensitivity. The results are shown in Table 4 together.

It was found that the planographic printing plate obtained according to the present invention had higher sensitivity than that of a plate described in U.S. Pat. No. 5,225,316.

Example-II
[Synthesis of sulfonic acid-generating type polymer compound]
Synthesis of monomer (compound A-4)
A monomer A-4 was prepared in the same manner as in Example-I.
Synthesis of monomer (compound A-5)
A monomer A-5 was prepared in the same manner as that of the synthesis method for the monomer A-4 except that 2,2,2-trifluoroethyl alcohol was used instead of cyclohexyl alcohol.
Synthesis of monomer (compound A-24)
A monomer A-24 was prepared in the same manner as that of the synthesis method for the monomer A-4 except that the following alcohol was used instead of cyclohexyl alcohol.

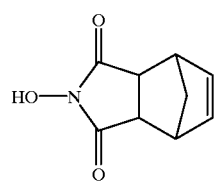

Synthesis of sulfonic acid-generating type polymer compound (B-1)
To a 100 ml three-necked flask were charged 7.18 g of a monomer A-4, 0.43 g of glycidyl methacrylate and 15 g of methyl ethyl ketone, and to this was added 0.1 g of azobis-dimethylvaleronitrile under nitrogen flow at 65° C. The mixture was stirred at this temperature for 5 hours, then methyl ethyl ketone was distilled off under reduced pressure to give a solid. It was found that this solid is composed of a polymer having a weight average molecular weight of 18,000 by using GPC (based on polystyrene).

Synthesis of sulfonic acid-generating type polymer compound (B-2)

To a 100 ml three-necked flask were charged 7.18 g of a monomer A-4, 0.74 g of trimethoxypropyl methacryloyl and 15 g of methyl ethyl ketone, and to this was added 0.1 g of azobisdimethylvaleronitrile under nitrogen flow at 65° C. The mixture was stirred at this temperature for 5 hours, then methyl ethyl ketone was distilled off under reduced pressure to give a solid. It was found that this solid is composed of a polymer having a weight average molecular weight of 12,000 by using GPC (based on polystyrene).

Synthesis of sulfonic acid-generating type polymer compound (B-3), (B-4)

A polymer having a weight average molecular weight of 35,000 (GPC, based on polystyrene) was obtained in the same manner as that of the synthesis method for the sulfonic acid-generating type polymer compound B-1 except that 7.18 g of a monomer A-5 instead of 7.18 g of a monomer A-4 [sulfonic acid-generating type polymer compound (B-3)].

Further, a polymer having a weight average molecular weight of 23,000 (GPC, based on polystyrene) was obtained in the same manner as that of the synthesis method for the sulfonic acid-generating type polymer compound B-2 except that 9.32 g of a monomer A-24 instead of 7.18 g of a monomer A-4 [sulfonic acid-generating type polymer compound (B-4)].

Synthesis of sulfonic acid-generating type polymer compound (B-8)

To a 200 ml three-necked flask were charged 20 g of a monomer A-4 and 40g of methyl ethyl ketone, and to this was added 0.25 g of azobisdimethylvaleronitrile under nitrogen flow at 65° C. The temperature was kept at this temperature with stirring for 5 hours, the solvent was distilled off under reduced pressure to give a solid. It was found that this solid is composed of a polymer having a weight average molecular weight of 10,400 by using GPC (based on polystyrene).

Examples 18 to 22

An aluminum plate (material 1050) having a thickness of 0.30 mm was degreased by washing with trichloroethylene. A roughening treatment was applied to the aluminum plate by graining the surface with a nylon brush and a suspension in which a 400-mesh powder of pumice stone is suspended in water, then washed completely with water. The plate was etched by being immersed in a 25% aqueous solution of sodium hydroxide of 45 ° C. for 9 seconds and washed with water. The plate was further immersed in a 2% $HNO_3$ for 20 seconds and washed with water. The etching amount of the grained surface was about 3 $g/m^2$. Then, the plate was provided with a direct current anodic oxidization film of 3 $g/m^2$ with 7% $H_2SO_4$ as the electrolyte and a current density of 15 $A/dm^2$, washed with water, and dried.

5 kinds of solutions (II-A-1) to (II-A-5) were prepared with changing the kind of the sulfonic acid-generating type polymer compound in the following solution (II-A). These solutions were respectively applied on aluminum plates which had been treated as described above, then the plates were dried for 2 minutes at 100° C. to give planographic printing plates (II-A-1) to (II-A-5). The weight after drying was 1.2 $g/m^2$.

Solution (II-A):

| | |
|---|---|
| Sulfonic acid-generating type polymer compound (shown in Table 5) | 1.0 g |
| Thermal base-generating agent: | |
| guanidine p-methanesulfonylphenylsulfonyl acetate | 0.15 g |
| Infrared ray absorbing agent NK-3508 (manufactured by Nippon Photosensitive Pigment Laboratory Corp.) | 0.15 g |
| Dye obtained by substituting a counter ion of Victoria Pure Blue BOH with 1-naphthalenesulfonic acid | 0.05 g |
| Megafack F-177 (manufactured by Dainippon Ink & Chemicals, Inc., fluorine-based surfactant) Methyl ethyl ketone | 0.06 g 20 g |
| Methyl alcohol | 7 g |

TABLE 5

| Example | Planographic Printing Plate | Sulfonic Acid-Generating Type Polymer Compound |
|---|---|---|
| Ex.18 | II-A-1 | B-(1) |
| Ex.19 | II-A-2 | B-(2) |
| Ex.20 | II-A-3 | B-(3) |
| Ex.21 | II-A-4 | B-(4) |
| Ex.22 | II-A-5 | B-(8) |

The resulting planographic printing plates II-A-1 to III-A-5 were irradiated with a YAG laser which emits an infrared ray having a wavelength of 1064 nm. After the irradiation, the plates were heated at 110° C. for 1 minute, then printed with Hydel KOR-D. Then, occurrence of pollution of a plate in non-image portion was observed. The results are shown in Table 6. All of them were excellent prints having no pollution in the non-image portion.

TABLE 6

| | Planographic Printing Plate | Pollution In Non-Image Portion in Printing |
|---|---|---|
| Ex.18 | II-A-1 | None |
| Ex.19 | II-A-2 | None |
| Ex.20 | II-A-3 | None |
| Ex.21 | II-A-4 | None |
| Ex.22 | II-A-5 | None |

The planograhpic printing plates of Examples 18 to 22 were left for 7 days under conditions of 45° C. and 75% RH, then printing was conducted using the same printing machine to obtain prints having no pollution. Therefore, the planographic printing plate obtained using the image recording material according to the present invention was found to be excellent in preservation stability under high temperature and high humidity conditions.

Examples 23 to 27

5 kinds of solutions (II-B-1) to (II-B-5) were prepared with changing the kind of the sulfonic acid-generating type polymer compound, in the following solution (II-B). These solutions were respectively applied on aluminum plates used in Examples 18 to 22, then the plates were dried for 2 minutes at 100° C., then further heated for 10 minutes at 100° C. to give planographic printing plates (II-B-1) to (II-B-5). The weight after drying was 1.7 g/m².

| Solution (II-B): | |
|---|---|
| Sulfonic acid-generating type polymer compound (shown in Table 7) | 0.06 g |
| Phthalic anhydride | 0.005 g |
| o-chlorophenol | 0.001 g |
| Thermal base-generating agent: | |
| guanidine trichloroacetate | 0.15 g |
| Infrared ray absorbing agent NK-2268 (manufactured by Nippon Photosensitive Pigment Laboratory Corp.) | 0.15 g |
| Novolak resin obtained from cresol and formaldehyde (meta:para = 8:2, weight average molecular weight 5,800) | 1.2 g |
| Resol resin obtained from bisphenol A and formaldehyde (weight average molecular weight 1,600) | 1.0 g |
| Dye obtained by substituting a counter ion of Victoria Pure Blue BOH with 1-naphthalenesulfonic acid | 0.03 g |
| Megafack F-177 (manufactured by Dainippon Ink & Chemicals, Inc., fluorine-based surfactant) | 0.06 g |
| Methyl ethyl ketone | 20 g |
| Methyl alcohol | 7 g |

TABLE 7

| | Planographic Printing Plate | Sulfonic Acid-Generating Type Polymer Compound |
|---|---|---|
| Ex.23 | II-B-1 | B-(1) |
| Ex.24 | II-B-2 | B-(3) |
| Ex.25 | II-B-3 | B-(8) |
| Ex.26 | II-B-4 | B-(7) |
| Ex.27 | II-B-5 | B-(5) |

The resulting planographic printing plates II-B-1 to TI-B-5 were left for 3 days under high temperature and high pressure conditions of 40° C. and 70% RH, then irradiated with a semiconductor laser which emits an infrared ray having a wavelength of 830 nm. After the irradiation, the plates were heated at 110° C. for 1 minute, and the surface thereof was treated with Gum GU-7 (1:1) manufactured by Fuji Photo Film Co., Ltd. not through a developing machine, and printed with Hydel KOR-D. Then, occurrence of pollution of the print in the non-image portion was observed. All of them were excellent prints having no pollution in the non-image portion.

Examples 28 to 32

The planograhpic printing plates (II-B-1) to (II-B-5) obtained in Examples 23 to 27 were irradiated with a semiconductor laser which emits an infrared ray having a wavelength of 830 nm. After the irradiation, the surface thereof was treated with Gum GU-7 (1:1) manufactured by Fuji Photo Film Co., Ltd. not through a developing machine, and printed with Hydel KOR-D. Then, the number of the prints was calculated. The results are shown in Table 8. There were obtained 70,000 or more prints which were all excellent.

TABLE 8

| Example | Planographic Printing Plate | Number Of Prints |
|---|---|---|
| Ex.28 | II-B-1 | 74,000 |
| Ex.29 | II-B-2 | 70,000 |
| Ex.30 | II-B-3 | 72,000 |
| Ex.31 | II-B-4 | 73,000 |
| Ex.32 | II-B-5 | 75,000 |

The results of Examples 28 to 32 showed that the planographic printing plate of the present invention is excellent in printing resistance in printing.

Example-III

[Synthesis of sulfonic acid-generating type polymer compound]

Synthesis of monomer A-4

A monomer A-4 was prepared in the same manner as in Example-I.

Synthesis of monomers A-5 and A-24

Monomer A-5 and A-24 were prepared in the same manner as in Example-II.

Synthesis of monomer A-28

To a 1 liter three-necked flask were charged 88.8 g of N-methylstyrenesulfonamide, 109.3 g of triethylamine, 5.5 g of dimethylaminopyridine and 200 ml of acetonitrile. This three-necked flask was cooled, and to this was added dropwise 119.2 g of benzenesulfonyl chloride dissolved in 200 ml of acetonitrile over 1 hour. After the addition, the mixture was stirred for 2 hours at room temperature, then left for overnight.

The reaction solution was poured into 800 ml of water, and extracted with 500 ml of ethyl acetate, and dried with magnesium sulfate and concentrated. The concentrate was purified using silica gel chromatography (hexane/ethyl acetate=3/1 (by volume) was used), then re-crystallized from 300 ml of isopropyl alcohol. 80.3 g of a white crystal having a melting point from 58.5 to 60° C. was obtained. The absorption spectrum of this crystal (in THF) was 265 nm ($\lambda$max) and $\epsilon$ was $2.0 \times 10^4$. Elemental Analysis: measured, C: 53.21%, H: 4.53%, N: 4.17%.

Synthesis of sulfonic acid-generating type polymer compounds (B-1) to (B-4) and (B-8)

Polymer compounds B-1 to B-4 and B-8 were prepared in the same manner as in Example-II.

Synthesis of sulfonic acid-generating type polymer compounds (B-5), (B-7), and (B-10) to (B-12)

Sulfonic acid-generating type polymer compounds (B-5), (B-7), and (B-10) to (B-12) were synthesized in the same manner as described above. The weight average molecular weights (GPC, based on polystyrene) were respectively 31,000, 15,000, 20,000, 13,000, and 41,000.

Examples 33 to 40

An aluminum plate (material 1050) having a thickness of 0.30 mm was degreased by washing with trichloroethylene. A roughening treatment was applied to the aluminum plate by graining the surface with a nylon brush and a suspension in which a 400-mesh powder of pumice stone is suspended in water, then washed completely with water. The plate was etched by being immersed in a 25% aqueous solution of sodium hydroxide of 45 ° C. for 9 seconds and washed with water. The plate was further immersed in a 2% $HNO_3$ for 20 seconds and washed with water. The etching amount of the grained surface was about 3 g/m². Then, the plate was provided with a direct current anodic oxidization film of 3 g/m² with 7% $H_2SO_4$ as the electrolyte and a current density of 15 A/dm², washed with water, and dried.

Then, 8 kinds of solutions (III-A-1) to (III-A-8) were prepared with changing the kind of the sulfonic acid-generating type polymer compound in the following solution (III-A). These solutions were respectively applied on aluminum plates which had been treated as described above, then the plates were dried for 2 minutes at 100° C. to give planographic printing plates (III-A-1) to (III-A-8) The weight after drying was 1.2 g/m².

Solution (III-A):

| | |
|---|---|
| Sulfonic acid-generating type polymer compound (shown in Table 9) | 1.0 g |
| Infrared ray absorbing agent NK-3508 (manufactured by Nippon Photosensitive Pigment Laboratory Corp.) | 0.15 g |
| Dye obtained by substituting a counter ion of Victoria Pure Blue BOH with 1-naphthalenesulfonic acid | 0.05 g |
| Megafack F-177 (manufactured by Dainippon Ink & Chemicals, Inc., fluorine-based surfactant) | 0.06 g |
| Methyl ethyl ketone | 20 g |
| Methyl alcohol | 7 g |

TABLE 9

| Planographic Printing Plate | Sulfonic Acid-Generating Type Polymer Compound |
|---|---|
| Ex.33 | III-A-1 | B-1 |
| Ex.34 | III-A-2 | B-2 |
| Ex.35 | III-A-3 | B-3 |
| Ex.36 | III-A-4 | B-4 |
| Ex.37 | III-A-5 | B-8 |
| Ex.38 | III-A-6 | B-10 |
| Ex.39 | III-A-7 | B-11 |
| Ex.40 | III-A-8 | B-12 |
| Comp.3 | III-A'-1 | III-R-1[*1] |

[*1] Carboxylic acid-generating type polymer compound

The resulting planographic printing plates III-A-1 to III-A-8 were irradiated with a YAG laser which emits an infrared ray having a wavelength of 1064 nm. After the irradiation, the plates were heated at 110° C. for 1 minute, then printed with Hydel KOR-D. Then, occurrence of pollution of a plate in non-image portion was observed. The results are shown in Table 10. All of them were excellent prints having no pollution in the non-image portion.

TABLE 10

| Planographic Printing Plate | Pollution In Non-Image Portion in Printing |
|---|---|
| Ex.33 | III-A-1 | None |
| Ex.34 | III-A-2 | None |
| Ex.35 | III-A-3 | None |
| Ex.36 | III-A-4 | None |
| Ex.37 | III-A-5 | None |
| Ex.38 | III-A-6 | None |
| Ex.39 | III-A-7 | None |
| Ex.40 | III-A-8 | None |
| Comp.3 | III-A'-1 | Recognized |

Comparative Example 3

A carboxylic acid-generating type polymer compound III-R-1 in the same manner as that of the synthesis method for the sulfonic acid-generating type polymer compound (B-2) except that the following monomer III-1 was used instead of the monomer A-4. It was found that this compound is a polymer having a weight average molecular weight of 15,000 by GPC (based on polystyrene).

A solution III-A'-1 was prepared in the same manner as described above except that a carboxylic acid-generating type polymer compound III-R-1 was used instead of the sulfonic acid-generating type polymer compound, in the solution III-A, the planographic printing plate III-A'-1 and planographic plate were prepared in the same manner as described above, and the test examination was conducted in the same manner as described above. The results are shown in Table 10.

Monomer III-1

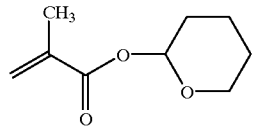

Carboxylic acid generating type polymer compound III-R-1

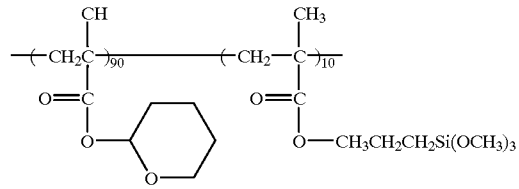

Examples 41 to 44

4 kinds of solutions (III-B-1) to (III-B-4) were prepared with changing the kind of the sulfonic acid-generating type polymer compound, in the following solution (III-B). These solutions were respectively applied on aluminum plates which had been applied with the primer used in Examples 33 to 40, then the plates were dried for 2 minutes at 100° C., then further heated for 10 minutes at 100° C. to give planographic printing plates (III-B-1) to (III-B-4). The weight after drying was 1.7 g/m².

| Solution (III-B): | |
|---|---|
| Sulfonic acid-generating type polymer compound (shown in Table 11) | 0.6 g |
| Phthalic anhydride | 0.005 g |
| o-chlorophenol | 0.001 g |
| Infrared ray absorbing agent NK-2268 (manufactured by Nippon Photosensitive Pigment Laboratory Corp.) | 0.15 g |
| Novolak resin obtained from cresol and formaldehyde (meta:para = 8:2, weight average molecular weight 5,800) | 1.2 g |
| Resol resin obtained from bisphenol A and formaldehyde (weight average molecular weight 1,600) | 1.0 g |
| Dye obtained by substituting a counter ion of Victoria Pure Blue BOH with 1-naphthalenesulfonic acid | 0.03 g |
| Megafack F-177 (manufactured by Dainippon Ink & Chemicals, Inc., fluorine-based surfactant) | 0.06 g |
| Methyl ethyl ketone | 20 g |
| Methyl alcohol | 7 g |

TABLE 11

| | Planographic printing plate | Sulfonic acid-generating type polymer compound |
|---|---|---|
| Ex.41 | III-B-1 | B-1 |
| Ex.42 | III-B-2 | B-3 |
| Ex.43 | III-B-3 | B-5 |
| Ex.44 | III-B-4 | B-7 |

The resulting planographic printing plates (III-B-1) to (III-B-4) obtained were left for 3 days under high temperature and high pressure conditions of 40° C. and 70% RH, then irradiated with a semiconductor laser which emits an infrared ray having a wavelength of 830 nm. After the irradiation, the plates were heated at 110° C. for 1 minute, and the surface thereof was treated with Gum GU-7 (1:1) manufactured by Fuji Photo Film Co., Ltd. not through a developing machine, and printed with Hydel KOR-D. Then, occurrence of pollution of the print in the non-image portion was observed. All of them were excellent prints having no pollution in the non-image portion.

Example-IV
[Synthesis of sulfonic acid-generating type polymer compound]
Synthesis of monomer A-4
A monomer A-4 was prepared in the same manner as in Example-I.
Synthesis of sulfonic acid-generating type polymer compound (B-8)
A polymer compound B-8 was prepared in the same manner as in Example-II.
Synthesis of sulfonic acid-generating type polymer compounds (B-1), (B-2), (B-9) and (B-14) to (B-21)
A sulfonic acid-generating type polymer compound (B-9) was synthesized with referring JP-A Nos. 2-100,053 and 2-100,054. Sulfonic acid-generating type polymer compounds (B-1), (B-2) and (B-14) to (B-21) were synthesized in the same manner as described above. Any of the weight average molecular weights (GPC, based on polystyrene) was from 10,000 to 50,000.

Examples 45 to 52

An aluminum plate (material 1050) having a thickness of 0.30 mm was degreased by washing with trichloroethylene. A roughening treatment was applied to the aluminum plate by graining the surface with a nylon brush and a suspension in which a 400-mesh powder of pumice stone is suspended in water, then washed completely with water. The plate was etched by being immersed in a 25% aqueous solution of sodium hydroxide of 45 ° C. for 9 seconds and washed with water. The plate was further immersed in a 2% $HNO_3$ for 20 seconds and washed with water. The etching amount of the grained surface was about 3 g/m². Then, the plate was provided with a direct current anodic oxidization film of 2.4 g/m² with 7% $H_2SO_4$ as the electrolyte and a current density of 15 A/dm², washed with water, and dried.

8 kinds of solutions (IV-A-1) to (IV-A-8) were prepared with changing the kind of the sulfonic acid-generating type polymer compound in the following solution (IV-A). These solutions were respectively applied on aluminum plates which had been treated as described above, then the plates were dried for 3 minutes at 80° C. to give planographic printing plates (IV-A-1) to (IV-A-8). The amount coated after drying was 1.2 g/m².

| Solution (IV-A): | |
|---|---|
| Sulfonic acid-generating type polymer compound (shown in Table 12) | 4.0 g |
| Infrared ray absorbing agent NK-3508 (manufactured by Nippon Photosensitive Pigment Laboratory Corp.) | 0.15 g |
| Acid-generating agent (diphenyliodonium anthraquinonesulfonate) | 0.15 g |
| Dye obtained by substituting a counter ion of Victoria Pure Blue BOH with 1-naphthalenesulfonic acid | 0.05 g |
| Megafack F-177 (manufactured by Dainippon Ink & Chemicals, Inc., fluorine-based surfactant) | 0.06 g |
| Methyl ethyl ketone | 20 g |
| γ-butyrolactone | 10 g |
| Dimethylformamide | 8 g |
| Water | 2 g |

The resulting planographic printing plates IV-A-1 to IV-A-8 were irradiated with a YAG laser which emits an infrared ray having a wavelength of 1064 nm. After the irradiation, the plates were (A) developed with water and printed with Hydel SOR-M, (B) heated at 100° C. for 3 minute, then developed with water and printed with Hydel SOR-M, (C) printed with Hydel SOR-M without any pretreatment or (D) heated at 100° C. for 3 minutes; then printed with Hydel SOR-M. Then, pollution of a plate in non-image portion was observed. The results are shown in Table 12. All of them were excellent prints having no pollution in the non-image portion.

TABLE 12

| | Polymer compound | Treatment (A) Pollution in non-image portion | Treatment (B) Pollution in non-image portion | Treatment (C) Pollution in non-image portion | Treatment (D) Pollution in non-image portion |
|---|---|---|---|---|---|
| Ex. 45 | IV-A-1 | B-8 | No problems | No problems | No problems | No problems |
| Ex. 46 | IV-A-2 | B-9 | No problems | No problems | No problems | No problems |
| Ex. 47 | IV-A-3 | B-14 | No problems | No problems | No problems | No problems |
| Ex. 48 | IV-A-4 | B-15 | No problems | No problems | No problems | No problems |
| Ex. 49 | IV-A-5 | B-16 | No problems | No problems | No problems | No problems |
| Ex. 50 | IV-A-6 | B-17 | No problems | No problems | No problems | No problems |
| Ex. 51 | IV-A-7 | B-18 | No problems | No problems | No problems | No problems |
| Ex. 52 | IV-A-8 | B-19 | No problems | No problems | No problems | No problems |

| | Polymer compound | | Treatment (A) Pollution in non-image portion | Treatment (B) Pollution in non-image portion | Treatment (C) Pollution in non-image portion | Treatment (D) Pollution in non-image portion |
|---|---|---|---|---|---|---|
| Ex. 45 | IV-A-1 | B-8 | No problems | No problems | No problems | No problems |
| Ex. 46 | IV-A-2 | B-9 | No problems | No problems | No problems | No problems |
| Ex. 47 | IV-A-3 | B-14 | No problems | No problems | No problems | No problems |
| Ex. 48 | IV-A-4 | B-15 | No problems | No problems | No problems | No problems |
| Ex. 49 | IV-A-5 | B-16 | No problems | No problems | No problems | No problems |
| Ex. 50 | IV-A-6 | B-17 | No problems | No problems | No problems | No problems |
| Ex. 51 | IV-A-7 | B-18 | No problems | No problems | No problems | No problems |
| Ex. 52 | IV-A-8 | B-19 | No problems | No problems | No problems | No problems |

Examples 53 to 56

4 kinds of solutions (IV-B-1) to (IV-B-4) were prepared with changing the kind of the sulfonic acid-generating type polymer compound, in the following solution (IV-B) These solutions were respectively applied on aluminum plates which had been applied with the primer used in Examples 45 to 52, then the plates were dried for 3 minutes at 80° C., then further heated for 1 hour at 90° C. to give planographic printing plates (IV-B-1) to (IV-B-4). The amount coated after drying was 1.7 g/m².

| Solution (IV-B): | |
|---|---|
| Sulfonic acid-generating type polymer compound (shown in Table 13) | 1.6 g |
| Phthalic anhydride | 0.005 g |
| o-chlorophenol | 0.001 g |
| Infrared ray absorbing agent NK-2014 (manufactured by Nippon Photosensitive Pigment Laboratory Corp.) | 0.02 g |
| Acid-generating agent (diphenyliodonium anthraquinonesulfonate) | 0.04 g |
| Dye obtained by substituting a counter ion of Victoria Pure Blue BOH with 1-naphthalenesulfonic acid | 0.03 g |
| Megafack F-177 (manufactured by Dainippon Ink & Chemicals, Inc., fluorine-based surfactant) | 0.06 g |
| Methyl ethyl ketone | 20 g |
| γ-butyrolactone | 10 g |
| Dimethylformamide | 8 g |
| Water | 2 g |

The resulting planographic printing plates IV-B-1 to IV-B-4 were irradiated with a semiconductor laser which emits an infrared ray having a wavelength of 830 nm. After the irradiation, the plates were (A) printed with Hydel SOR-M without any pretreatment, or (B) heated at 100° C. for 3 minute, then printed with Hydel SOR-M; not through a developing machine. Then, occurrence of pollution of a plate in non-image portion was observed. The results are shown in Table 13. All of them were excellent prints having no pollution in the non-image portion.

TABLE 13

| | Polymer compound | | Treatment (A) Pollution in non-image portion | Treatment (B) Pollution in non-image portion |
|---|---|---|---|---|
| Ex.53 | IV-B-1 | B-1 | No problems | No problems |
| Ex.54 | IV-B-2 | B-2 | No problems | No problems |
| Ex.55 | IV-B-3 | B-20 | Somewhat polluted | No problems |
| Ex.56 | IV-B-4 | B-21 | No problems | No problems |

Examples 57 to 60 and Comparative Example 4

Solutions (IV-C-1) to (IV-C-4) were prepared with changing the kind of a photo acid-generating agent in the following solution (IV-C). Further, a solution (IV-C-5) was prepared containing no photo acid-generating agent as Comparative Example. These solutions were respectively applied on aluminum plates which had been applied with the primer used in Examples 45 to 52, then the plates were dried for 3 minutes at 80° C., to give planographic printing plates (IV-C-1) to (IV-C-5). The amount applied after drying was 1.2 g/m².

| Solution (IV-C): | |
|---|---|
| Sulfonic acid-generating type polymer compound (B-8) | 2.0 g |
| Infrared absorbing agent (the following compound) | 0.15 g |
| Acid-generating agent (compound in Table 14 and the following compound) | 0.1 g |
| Dye obtained by substituting a counter ion of Victoria Pure Blue BOH with 1-naphthalenesulfonic acid | 0.05 g |
| Megafack F-177 (manufactured by Dainippon Ink & Chemicals, Inc., fluorine-based surfactant) | 0.06 g |
| Methyl ethyl ketone | 10 g |
| Dimethylformamide | 8 g |
| Water | 2 g |
| γ-butyrolactone | 10 g |

Infrared ray absorbing agent

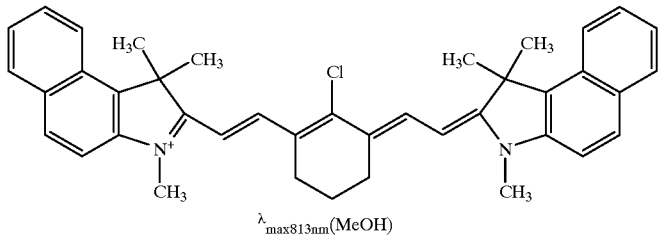

$\lambda_{max}813nm(MeOH)$

Acid-generating agent

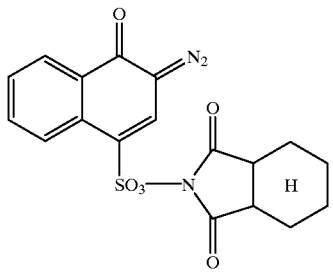

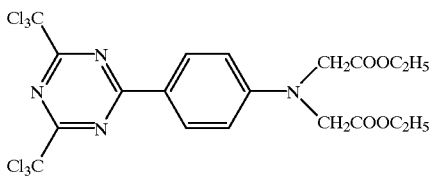

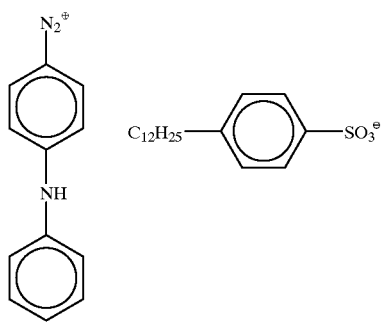

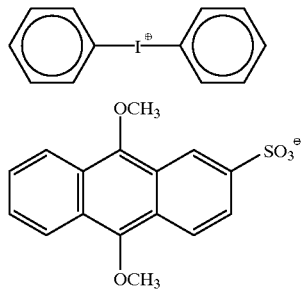

The resulted planographic printing plates IV-C-1 to IV-C-5 were irradiated with a semiconductor laser which emits an infrared ray having a wavelength of 830 nm. After the irradiation, the plates were heated at 100° C. for 3 minutes and printed with Hydel SOR-M. Then, occurrence of pollution of a plate in non-image portion was observed.

The results are shown in Table 14. When the acid-generating agent was removed, a clear non-image portion was not obtained. On the other hand, when the photo acid-generating agent was added, excellent prints were obtained.

TABLE 14

| | Acid-generating agent | | Pollution in non-image portion |
|---|---|---|---|
| Ex.57 | IV-C-1 | IV-(1) | No problems |
| Ex.58 | IV-C-2 | IV-(2) | No problems |
| Ex.59 | IV-C-3 | IV-(3) | No problems |
| Ex.60 | IV-C-4 | IV-(4) | No problems |
| Ex.61 | IV-C-5 | None | Somewhat polluted |

What is claimed is that:

1. A planographic printing plate comprising a substrate having thereon a recording layer containing a photo acid-generating agent and a polymer compound carrying on a side chain a functional group which generates sulfonic acid in the presence of an acid selected from a group consisting of the following formulae (1) and (2):

$$—L^1—SO_2—O—R^1 \qquad (1)$$

wherein $L^1$ represents a first organic group comprised of a polyvalent non-metal atom which connects a first unit represented by formula (1) to a polymer backbone, and $R^1$ represents a substituted or unsubstituted aryl group, a substituted or unsubstituted alkyl group or cyclic imide group; and $$—L^2—SO_2—SO_2—R^2 \qquad (2)$$

wherein $L^2$ represents a second organic group comprised of a polyvalent non-metal atom which connects a second unit represented by formula (2) to a polymer backbone, and $R^2$ represents a substituted or unsubstituted aryl group or a substituted or unsubstituted alkyl group.

2. A planographic printing plate comprising a substrate having thereon a recording layer containing a thermal base-generating agent and carrying on a side chain a functional group which generates sulfonic acid in the presence of a base selected from a group consisting of the following formulae (1) to (3):

$$—L^1—SO_2—O—R^1 \qquad (1)$$

wherein $L^1$ represents a first organic group comprised of a polyvalent non-metal atom which connects a first unit represented by formula (1) to a polymer-backbone, and $R^1$ represents a substituted or unsubstituted aryl group, a substituted or unsubstituted alkyl group or cyclic imide group;

$$—L^2—SO_2—SO_2—R^2 \qquad (2)$$

wherein $L^2$ represents a second organic group comprised of a polyvalent non-metal atom which connects a second unit represented by formula (2) to a polymer backbone, and $R^2$ represents a substituted of unsubstituted aryl group or a substituted or unsubstituted alkyl group; and

 (3)

wherein $L^3$ represents a third organic group comprised of a polyvalent non-metal atom which connects a third unit represented by formula (3) to a polymer backbone, $R^3$ represents a substituted or unsubstituted aryl group or a substituted or unsubstituted alkyl group, $R^4$ represents a substituted or unsubstituted aryl group, a substituted or unsubstituted alkyl group or $R^5$, and $R^5$ represents a substituted or unsubstituted aryl group or a substituted or unsubstituted alkyl group.

3. The planographic printing plate according to claim 2, wherein said functional group is represented by formula (1).

4. A planographic printing plate comprising a substrate having thereon a recording layer containing an infrared ray absorbing agent, an acid-generating agent and a polymer compound carrying on a side chain a functional group which generates sulfonic acid in the presence of heat, selected from a group consisting of the following formulae (1) and (2):

$-L^1-SO_2-O-R^1$ (1)

wherein $L^1$ represents a first organic group comprised of a polyvalent non-methal atom which connects a first unit represented by formula (1) to a polymer backbone, and $R^1$ represents a substituted or unsubstituted aryl group, a substituted or unsubstituted alkyl group or cyclic imide group; and $-L^2-SO_2-SO_2-R^2$ (2)

wherein $L^2$ represents a second organic group comprised of a polyvalent non-metal atom which connects a second unit represented by formula (2) to a polymer backbone, and $R^2$ represents a substituted or unsubstituted aryl group or a substituted or unsubstituted alkyl group.

5. A planographic printing plate comprising a substrate having thereon a recording layer containing an infrared ray absorbing agent and a polymer compound carrying on a side chain a functional group which generates sulfonic acid in the presence of heat, selected from a group consisting of the following formula (1):

$-L^1-SO_2-O-R^1$ (1)

wherein $L^1$ represents a first organic group comprised of a polyvalent non-metal atom which connects a first unit represented by formula (1) to a polymer backbone, and $R^1$ represents a secondary alkyl group.

6. A planographic printing plate comprising a substrate having thereon a recording layer containing an infrared ray absorbing agent; and a polymer compound carrying on a side chain a functional group which generates sulfonic acid in the presence of heat, and selected from the group consisting of the following formulae (1) to (3):

$-L^1-SO_2-O-R^1$ (1)

wherein $L^1$ represents a first organic group comprised of a polyvalent non-metal atom which connects a first unit represented by formula (1) to a polymer backbone, and $R^1$ represents a substituted or unsubstituted aryl group, or a substituted or unsubstituted alkyl group;

$-L^2-SO_2-SO_2-R^2$ (2)

wherein $L^2$ represents a second organic group comprised of a polyvalent non-metal atom which connects a second unit represented by formula (2) to a polymer backbone, and $R^2$ represents a substituted or unsubstituted aryl group or a substituted or unsubstituted alkyl group;

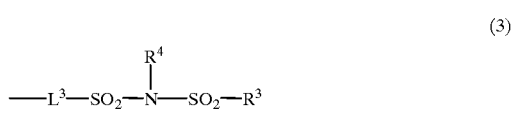 (3)

wherein $L^3$ represents a third organic group comprised of a polyvalent non-metal atom which connects a third unit represented by formula (3) to a polymer backbone, $R^3$ represents a substituted or unsubstituted aryl group or a substituted or unsubstituted alkyl group, $R^4$ represents a substituted or unsubstituted aryl group, a substituted or unsubstituted alkyl group or $R^5$, and $R^5$ represents a substituted or unsubstituted aryl group or a substituted or unsubstituted alkyl group; and wherein the planographic printing plate is a positive planographic printing plate.

7. The planographic printing plate according to claim 6, wherein said functional group is selected from the group consisting of formulae (1) and (2).

8. The planographic printing plate according to claim 7, wherein said functional group is represented by formula (1).

9. The planographic printing plate according to claim 8, wherein $R^1$ is a substituted aryl group or a substituted alkyl group wherein the substituent is selected from the group consisting of alkoxy group, halogen atom, alkyl group substituted with halogen, alkoxycarbonyl group, carbonate group, ether group, nitro group and cyano group.

* * * * *